United States Patent
Hoang et al.

(10) Patent No.: US 11,397,886 B2
(45) Date of Patent: Jul. 26, 2022

(54) VERTICAL MAPPING AND COMPUTING FOR DEEP NEURAL NETWORKS IN NON-VOLATILE MEMORY

(71) Applicant: SanDisk Technologies LLC, Addison, TX (US)

(72) Inventors: Tung Thanh Hoang, San Jose, CA (US); Martin Lueker-Boden, Fremont, CA (US); Anand Kulkarni, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 136 days.

(21) Appl. No.: 16/899,734

(22) Filed: Jun. 12, 2020

(65) Prior Publication Data

US 2021/0342676 A1    Nov. 4, 2021

Related U.S. Application Data

(63) Continuation of application No. 16/861,862, filed on Apr. 29, 2020.

(51) Int. Cl.
*G06N 3/063* (2006.01)
*G06N 3/04* (2006.01)
(Continued)

(52) U.S. Cl.
CPC .............. *G06N 3/063* (2013.01); *G06N 3/04* (2013.01); *H01L 23/481* (2013.01); *H01L 24/05* (2013.01);
(Continued)

(58) Field of Classification Search
None
See application file for complete search history.

(56) References Cited

U.S. PATENT DOCUMENTS 7,324,366 B2    1/2008  Bednorz et al.
7,505,347 B2    3/2009  Rinerson et al.
(Continued)

FOREIGN PATENT DOCUMENTS

CN    110597555 A    12/2019
CN    110598858 A    12/2019

OTHER PUBLICATIONS

Rastegari, Mohammad et al., "XNOR-Net: ImageNet Classification Using Binary Convolutional Neural Networks," proceedings ECCV 2016, Aug. 2016, 55 pages.
(Continued)

*Primary Examiner* — Evren Seven
(74) *Attorney, Agent, or Firm* — Vierra Magen Marcus LLP

(57) ABSTRACT

A non-volatile memory structure capable of storing layers of a deep neural network (DNN) and perform an inferencing operation within the structure is presented. A stack of bonded die pairs is connected by through silicon vias. Each bonded die pair includes a memory die, having one or more memory arrays onto which layers of the neural network are mapped, and a peripheral circuitry die, including the control circuits for performing the convolution or multiplication for the bonded die pair. The multiplications can either be done in-array on the memory die or in-logic on the peripheral circuitry die. The arrays can be formed into columns along the vias, allowing an inferencing operation to be performed by propagating an input up and down the columns, with the output of one level being the input of the subsequent layer.

20 Claims, 20 Drawing Sheets

(51) Int. Cl.
*H01L 23/48* (2006.01)
*H01L 25/18* (2006.01)
*H01L 23/00* (2006.01)

(52) U.S. Cl.
CPC .............. *H01L 24/08* (2013.01); *H01L 25/18* (2013.01); *H01L 2224/0557* (2013.01); *H01L 2224/08147* (2013.01); *H01L 2924/1431* (2013.01); *H01L 2924/1443* (2013.01); *H01L 2924/14511* (2013.01)

(56) References Cited

U.S. PATENT DOCUMENTS

| | | | |
|---|---|---|---|
| 8,416,624 | B2 | 4/2013 | Lei et al. |
| 8,430,735 | B2 | 8/2013 | Vali et al. |
| 8,634,247 | B1 | 1/2014 | Sprouse et al. |
| 8,634,248 | B1 | 1/2014 | Sprouse et al. |
| 8,773,909 | B2 | 7/2014 | Li et al. |
| 8,780,632 | B2 | 7/2014 | Sprouse et al. |
| 8,780,633 | B2 | 7/2014 | Sprouse et al. |
| 8,780,634 | B2 | 7/2014 | Sprouse et al. |
| 8,780,635 | B2 | 7/2014 | Li et al. |
| 8,792,279 | B2 | 7/2014 | Li et al. |
| 8,811,085 | B2 | 8/2014 | Sprouse et al. |
| 8,817,541 | B2 | 8/2014 | Li et al. |
| 9,098,403 | B2 | 8/2015 | Sprouse et al. |
| 9,104,551 | B2 | 8/2015 | Sprouse et al. |
| 9,116,796 | B2 | 8/2015 | Sprouse et al. |
| 9,384,126 | B1 | 7/2016 | Sprouse et al. |
| 9,887,240 | B2 | 2/2018 | Shimabukuro et al. |
| 10,127,150 | B2 | 11/2018 | Sprouse et al. |
| 10,459,724 | B2 | 10/2019 | Yu et al. |
| 10,528,643 | B1 | 1/2020 | Choi et al. |
| 10,535,391 | B2 | 1/2020 | Osada et al. |
| 10,643,119 | B2 | 5/2020 | Chiu et al. |
| 10,643,705 | B2 | 5/2020 | Choi et al. |
| 2014/0133228 | A1 | 5/2014 | Sprouse et al. |
| 2014/0133233 | A1 | 5/2014 | Li et al. |
| 2014/0133237 | A1 | 5/2014 | Sprouse et al. |
| 2014/0136756 | A1 | 5/2014 | Sprouse et al. |
| 2014/0136757 | A1 | 5/2014 | Sprouse et al. |
| 2014/0136758 | A1 | 5/2014 | Sprouse et al. |
| 2014/0136760 | A1 | 5/2014 | Sprouse et al. |
| 2014/0136762 | A1 | 5/2014 | Li et al. |
| 2014/0136763 | A1 | 5/2014 | Li et al. |
| 2014/0136764 | A1 | 5/2014 | Li et al. |
| 2014/0156576 | A1 | 6/2014 | Nugent |
| 2014/0136761 | A1 | 7/2014 | Li et al. |
| 2014/0294272 | A1 | 10/2014 | Madhabushi et al. |
| 2015/0324691 | A1 | 11/2015 | Dropps et al. |
| 2016/0026912 | A1 | 1/2016 | Falcon et al. |
| 2016/0379108 | A1 | 12/2016 | Chung et al. |
| 2016/0379109 | A1 | 12/2016 | Chung et al. |
| 2017/0098156 | A1 | 4/2017 | Nino et al. |
| 2017/0185888 | A1* | 6/2017 | Chen .................. G06N 3/02 |
| 2017/0228637 | A1 | 8/2017 | Santoro et al. |
| 2018/0039886 | A1 | 2/2018 | Umuroglu et al. |
| 2018/0075339 | A1 | 3/2018 | Ma et al. |
| 2018/0144240 | A1 | 5/2018 | Garbin et al. |
| 2018/0232627 | A1 | 8/2018 | Rozen et al. |
| 2018/0285727 | A1 | 10/2018 | Baum et al. |
| 2019/0087708 | A1* | 3/2019 | Goulding ............ G06F 12/0824 |
| 2019/0251425 | A1 | 8/2019 | Jaffari et al. |
| 2019/0318230 | A1* | 10/2019 | Cho .................... H01L 27/2463 |
| 2020/0034697 | A1 | 1/2020 | Choi et al. |
| 2020/0097826 | A1* | 3/2020 | Du ...................... G06N 3/0454 |
| 2020/0160160 | A1 | 5/2020 | Kim et al. |
| 2020/0293828 | A1* | 9/2020 | Wang .................. G06K 9/6245 |
| 2020/0319814 | A1* | 10/2020 | Kato ................... G06F 13/4022 |
| 2021/0064960 | A1* | 3/2021 | Chung .................. G06N 3/063 |
| 2021/0086089 | A1* | 3/2021 | Pardeshi ................ G06N 3/04 |
| 2021/0125045 | A1* | 4/2021 | Jang ..................... H01L 25/18 |
| 2021/0132954 | A1* | 5/2021 | Song ................... G06N 3/0481 |

OTHER PUBLICATIONS

Wan, Diwen, et al., "TBN: Convolutional Neural Network with Ternary Inputs and Binary Weights," ECCV 2018, Oct. 2018, 18 pages.
Chen, Yu-Hsin, et al., "Eyeriss: An Energy-Efficient Reconfigurable Accelerator for Deep Convolutional Neural Networks," IEEE Journal of Solid-State Circuits, Feb. 2016, 12 pages.
Sun, Xiaoyu, et al., "Fully Parallel RRAM Synaptic Array for Implementing Binary Neural Network with (+1, −1) Weights and (+1, 0) Neurons," 23rd Asia and South Pacific Design Automation Conference, Jan. 2018, 6 pages. Gonugondla, Sujan K., et al., "Energy-Efficient Deep In-memory Architecture for NAND Flash Memories," IEEE International Symposium on Circuits and Systems (ISCAS), May 2018, 5 pages.
Gonugondla, Sujan K., et al., "Energy-Efficient Deep In-memory Architecture for NAND Flash Memories," IEEE International Symposium on Circuits and Systems (ISCAS), May 2018, 5 pages.
Nakahara, Hiroki, et al., "A Memory-Based Realization of a Binarized Deep Convolutional Neural Network," International Conference on Field-Programmable Technology (FPT), Dec. 2016, 4 pages.
Takeuchi, Ken, "Data-Aware NAND Flash Memory for Intelligent Computing with Deep Neural Network," IEEE International Electron Devices Meeting (IEDM), Dec. 2017, 4 pages.
Mochida, Reiji, et al., "A 4M Synapses integrated Analog ReRAM based 66.5 TOPS/W Neural-Network Processor with Cell Current Controlled Writing and Flexible Network Architecture," Symposium on VLSI Technology Digest of Technical Papers, Jun. 2018, 2 pages.
Chiu, Pi-Feng, et al., "A Differential 2R Crosspoint RRAM Array With Zero Standby Current," IEEE Transactions on Circuits and Systems-II: Express Briefs, vol. 62, No. 5, May 2015, 5 pages.
Chen, Wei-Hao, et al., "A 65nm 1Mb Nonvolatile Computing-in-Memory ReRAM Macro with Sub-16ns Mulitply-and-Accumulate for Binary DNN AI Edge Processors," IEEE International Solid-State Circuits Conference, Feb. 2018, 3 pages.
Liu, Rui, et al., "Parallelizing SRAM Arrays with Customized Bit-Cell for Binary Neural Networks," DAC '18, Jun. 2018, 6 pages.
Courbariaux, Matthieu, et al., "Binarized Neural Networks: Training Neural Networks with Weights and Activations Constrained to +1 or −1," arXiv.org, Mar. 2016, 11 pages.
Simon, Noah, et al., "A Sparse-Group Lasso," Journal of Computational and Graphical Statistics, vol. 22, No. 2, pp. 231-245, downloaded by Moskow State Univ Bibliote on Jan. 28, 2014.
CS231n Convolutional Neural Networks for Visual Recognition, [cs231.github.io/neural-networks-2/#reg], downloaded on Oct. 15, 2019, pp. 1-15.
Krizhevsky, Alex, et al., "ImageNet Classification with Deep Convolutional Neural Networks," [http://code.google.com/p/cuda-convnet/ ], downloaded on Oct. 15, 2019, 9 pages.
Shafiee, Ali, et al., "ISAAC: A Convolutional Neural Network Accelerator with In-Situ Analog Arithmetic in Crossbars," ACM/IEEE 43rd Annual International Symposium on Computer Architecture (ISCA), Octobers, 2016, 13 pages.
Han, Song, et al., "Learning both Weights and Connections for Efficient Neural Networks," Conference paper, NIPS, Oct. 2015, 9 pages.
Jia, Yangqing, "Learning Semantic Image Representations at a Large Scale," Electrical Engineering and CS, University of Berkeley, Technical Report No. UCB/EECS-2014-93, May 16, 2014, 104 pages.
Wen, Wei, et al., "Learning Structured Sparsity in Deep Neural Networks," 30th Conference on Neural Information Processing Systems (NIPS 2016), Nov. 2016, 9 pages.
Wang, Peiqi, et al., "SNrram: An Efficient Sparse Neural Network Computation Architecture Based on Resistive Random-Access Memory," DAC '18, Jun. 24-29, 2018, 6 pages.
Zheng, Shixuan, et al., "An Efficient Kernel Transformation Architecture for Binary- and Ternary-Weight Neural Network Inference," DAC' 18, Jun. 24-29, 2018, 6 pages.
Resch, Salonik, et al., "PIMBALL: Binary Neural Networks in Spintronic Memory," ACM Trans. Arch. Code Optim., vol. 37, No. 4, Article 111, Aug. 2018, 25 pages.

(56) References Cited

OTHER PUBLICATIONS

Zamboni, Maurizio, et al., "In-Memory Binary Neural Networks," Master's Thesis, Politecino Di Torino, Apr. 10, 2019, 327 pages.

Natsui, Masanori, et al., "Design of an energy-efficient XNOR gate based on MTJ-based nonvolatile logic-in-memory architecture for binary neural network hardware," Japanese Journal of Applied Physics 58, Feb. 2019, 8 pages.

U.S. Appl. No. 62/702,713, filed Jul. 24, 2018.
U.S. Appl. No. 16/368,441, filed Mar. 28, 2019.
U.S. Appl. No. 16/653,346, filed Oct. 15, 2019.
U.S. Appl. No. 16/653,365, filed Oct. 15, 2019.
U.S. Appl. No. 16/722,580, filed Dec. 20, 2019.
U.S. Appl. No. 16/861,862, filed Apr. 29, 2020.

Yin, Shihui et al., "High-Throughput In-Memory Computing for Binary Deep Neural Networks With Monolithically Integrated RRAM and 90-nm CMOS," IEEE Transactions on Electron Devices, vol. 67, No. 10, Oct. 2020, 8 pages.

Donato, Marco, et al., "On-Chip Deep Neural Network Storage with Multi-Level eNVM," DAC'18, Association for Computing Machinery, Jun. 2018, 6 pages.

Shehzad, Faisal, et al., "A Scalable System-on-Chip Acceleration for Deep Neural Networks," Digital Object Identifier, Access 2021, vol. 9, Jul. 2021, 15 pages.

Shi, B., et al., "SOA-Based Photonic Integrated Deep Neural Networks for Image Classification," CLEO 2019, May 2019, 2 pages.

Notice of Allowance dated Feb. 7, 2022, U.S. Appl. No. 16/861,862, filed Apr. 29, 2020.

\* cited by examiner

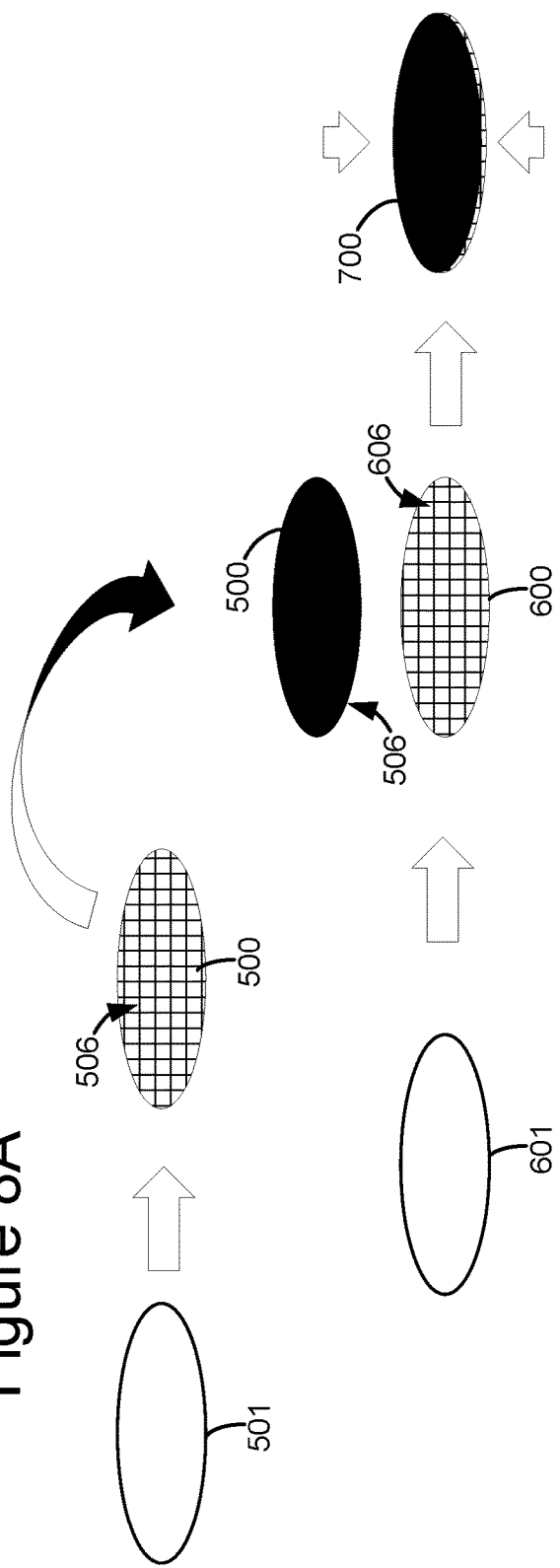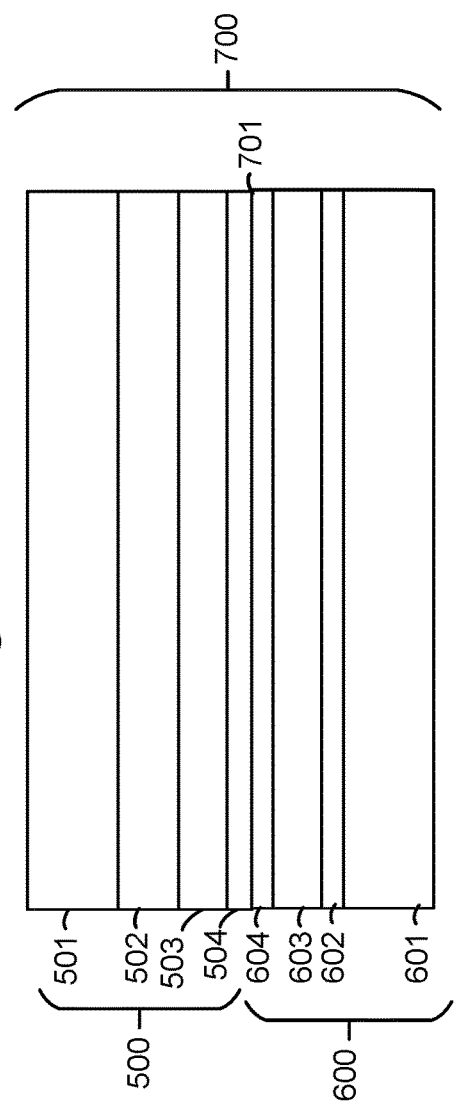

VERTICAL MAPPING AND COMPUTING FOR DEEP NEURAL NETWORKS IN NON-VOLATILE MEMORY

CLAIM OF PRIORITY

This application is a continuation application of U.S. patent application Ser. No. 16/861,862, entitled "VERTICAL MAPPING AND COMPUTING FOR DEEP NEURAL NETWORKS IN NON-VOLATILE MEMORY," filed Apr. 29, 2020, and incorporated by reference herein in its entirety.

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWING

Like-numbered elements refer to common components in the different figures.

FIGS. 8A-C illustrate wafer-to-wafer bonding and structures formed.

DETAILED DESCRIPTION

When a neural network performs an inference or training operation, large numbers of computations involving large amounts of data are performed, particularly in the case of Deep Neural Networks, or DNNs, that involve large numbers of layers through which the inputs must be propagated. To avoid the movement of large amounts of data in and out of the memory device, the weights of the layers for a neural network are stored in the non-volatile memory arrays of the memory device and the computations for each of the layers are performed on the device. To improve performance and capabilities, the embodiments described below use bonded die pairs, where a first die includes one or more memory arrays and the peripheral circuitry, including the control circuitry used to perform the memory operations is moved onto a second die. The second, memory die of the bonded die pair can have increased capacity, as all of its area is devoted to memory cells, and its processing can be optimized for the memory cell technology. The peripheral circuitry die of the bonded die pair can use processing optimized for the control circuitry elements, such as CMOS processing, and the additional area available on the CMOS die can be used for additionally logic elements and functionalities. When used for a neural network, the weights of a layer can be stored in an array of the memory die of a boded die pair and the activations of neural network can be performed in logic elements of the CMOS die of the bonded die pair. Depending on the embodiment, the computations (multiplications, convolutions) of a layer's inputs with its weights can either be performed in-memory, by translating to the inputs into voltage levels applied along word lines of the array, or performed in-logic, by reading the weights out into the CMOS die and performing the computations in the logic elements there.

The bonded die pairs can be stacked into a three dimensional structure, where the bonded die pairs of one layer can be connected to the bonded die pairs other layers of the stack by use of through silicon vias, or TSVs. The outputs of one layer of the stack can then be transferred to another layer of the stack, where they serve as inputs. The arrays of the memory die can be organized into columns along the vias. By mapping a neural network into the 3D structure of stacked memory die pairs, the weights of each layer, whether a convolutional layer or a fully connected layer, can stored in an array along the columns and an inferencing operation can be performed by receiving the network inputs at first layer and propagating the inputs through the layers of the structure.

Figure 1:
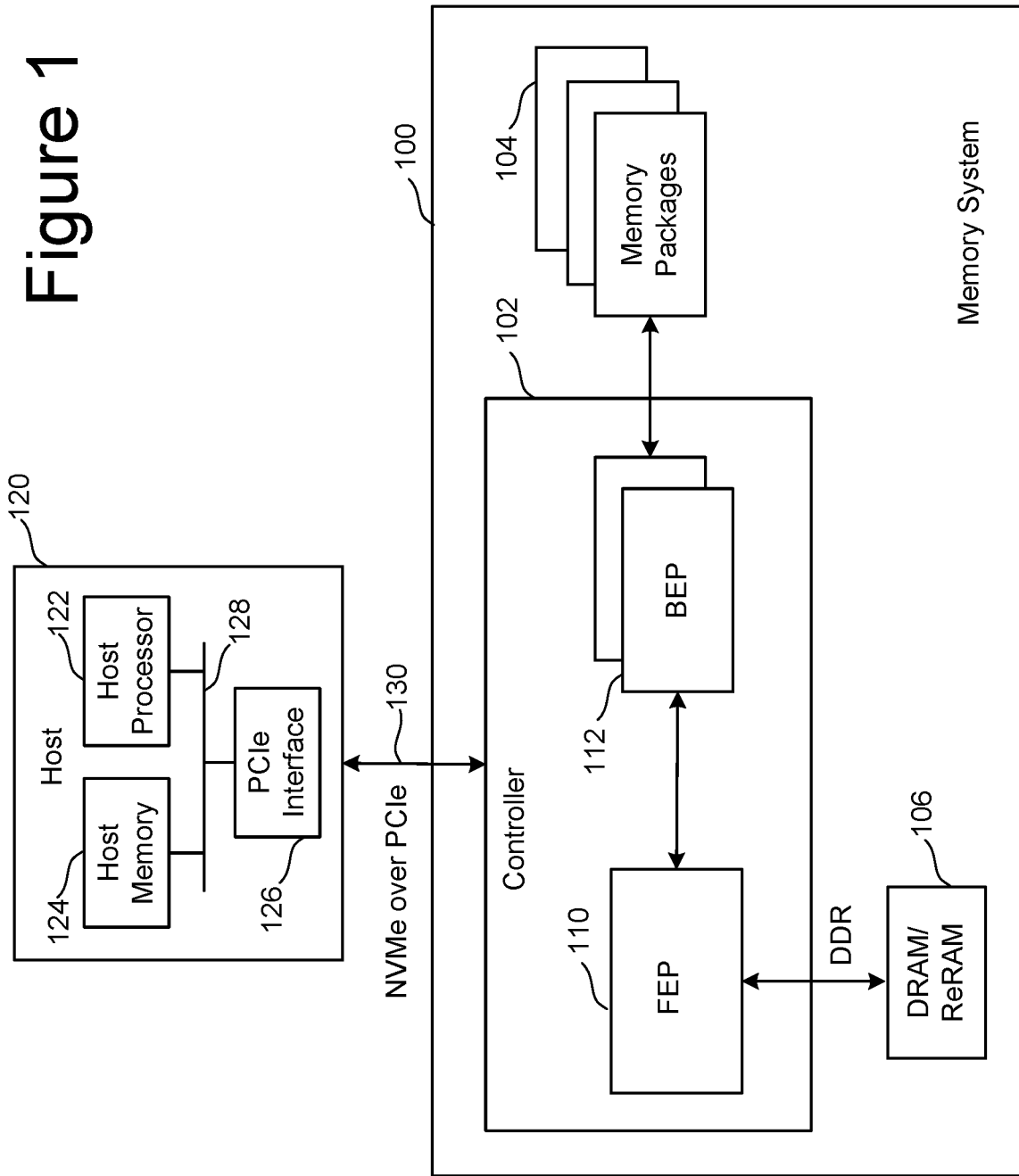
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM).

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
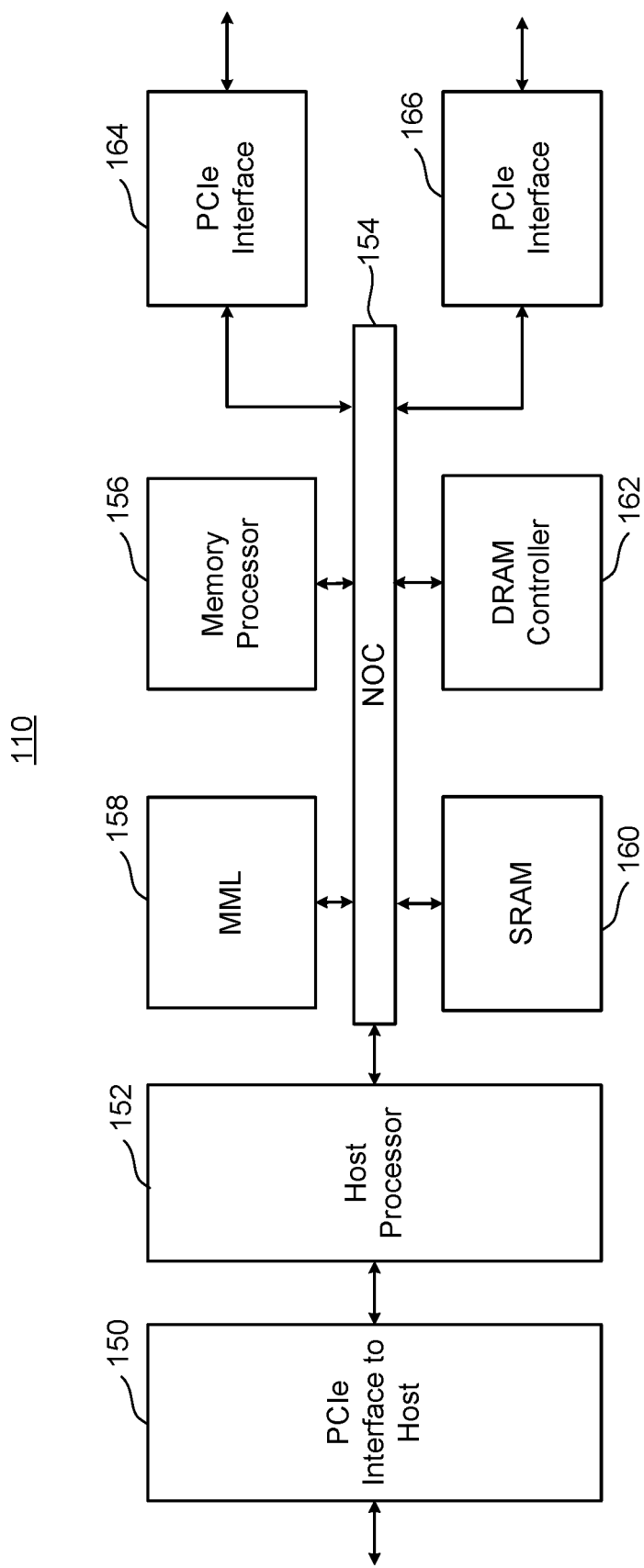
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
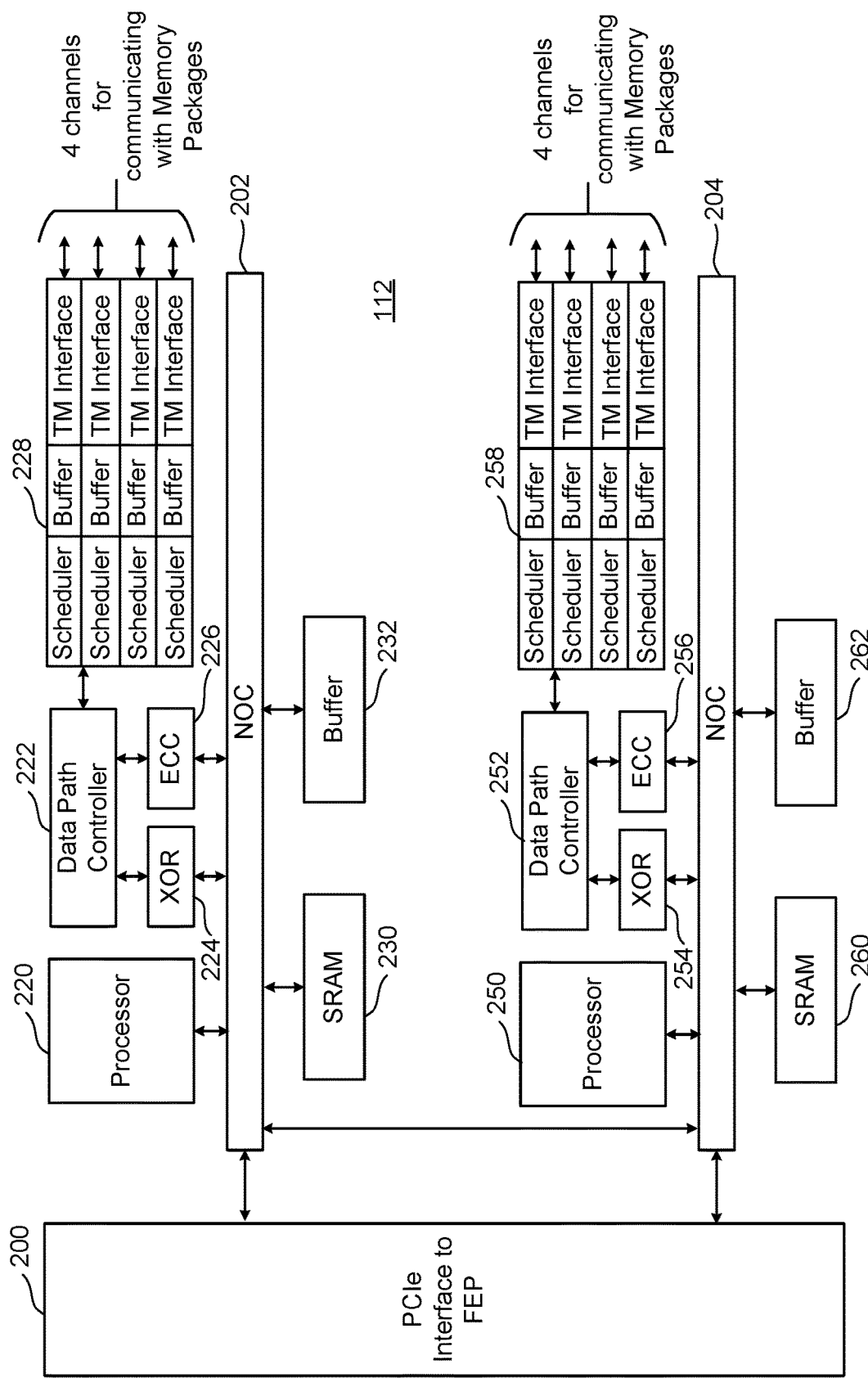
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
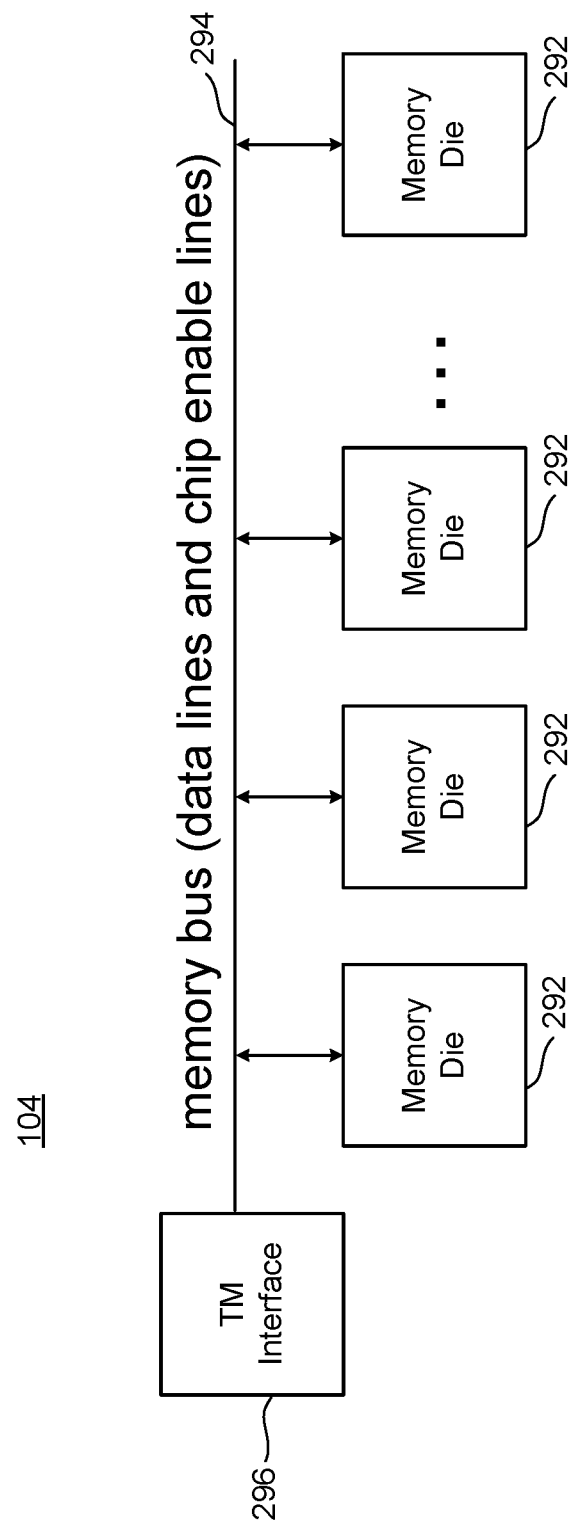
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
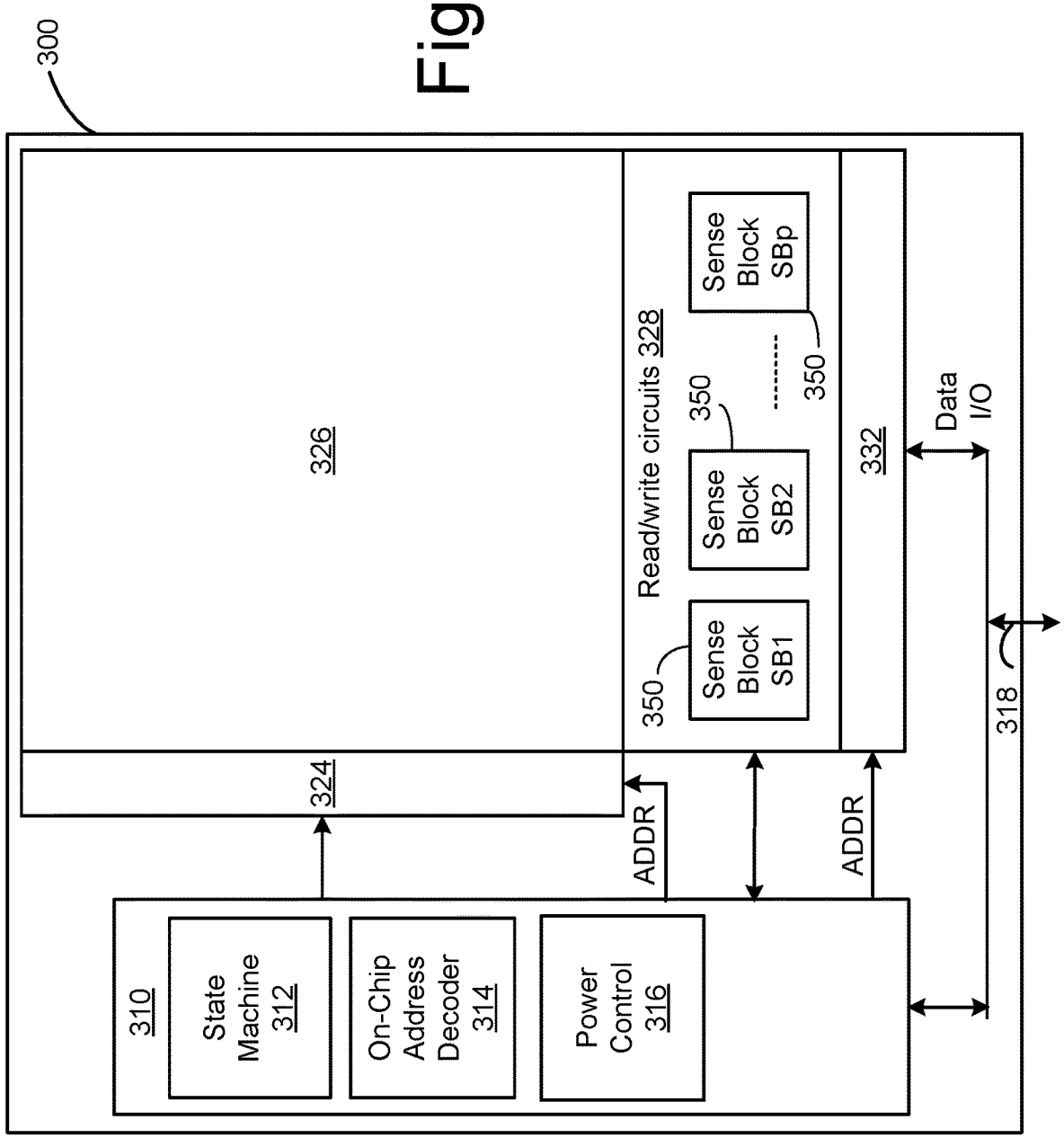
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" can include a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the memory structure 326 of the memory cells and the peripheral circuitry, including all of the other elements. An important characteristic of a memory circuit is its capacity, which can be increased by increasing the area of the memory die 300 that is given over to the memory structure 326; however, this reduces the area of the memory die 300 available for the peripheral circuitry. This can place quite serve restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is amount of area to devote to the memory structure 326 and the amount of area to devote to the peripheral circuitry.

Another area in which the memory structure 326 and the peripheral circuitry are often at odds is in the processing involved in forming these regions, since these regions often involve differing processing technologies and the trade-off in having differing technologies on a single die. For example, when the memory structure 326 is NAND flash, this is an NMOS structure, while the peripheral circuitry is often CMOS based. For example, sense amplifier circuits in the sense blocks 350, charge pumps in the power control block 316, logic elements in the state machine 312, and other peripheral circuitry often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for the memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
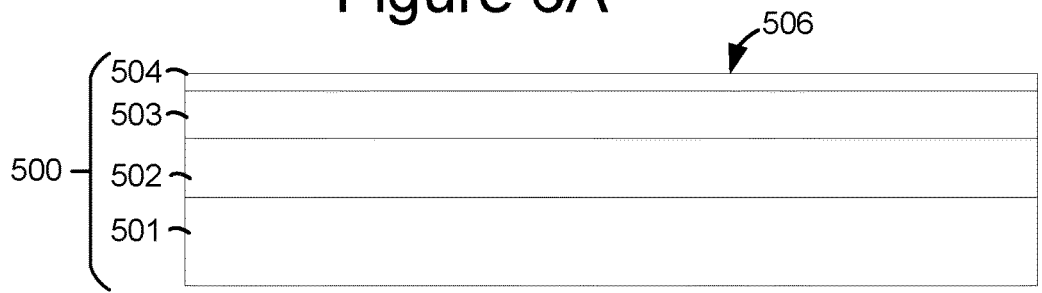
FIGS. 6A-B illustrate an array workpiece including pads for bonding.

FIG. 6A illustrates some layers of a non-volatile memory die such as memory structure 326 after interconnect and bonding features are formed. FIG. 6A shows a cross-section of a workpiece 500 that includes a substrate 501, for example, a silicon substrate such as a silicon wafer (e.g. 300 mm wafer) or a portion of a wafer. The term workpiece may refer to a substrate (e.g. wafer or portion of a wafer) and components formed in or on the substrate including electrical components such as active components, interconnect layers, dielectric layers, and bond pads. On and above substrate 501 is an intermediate region 502 that may include blocks of non-volatile memory cells. In an upper region 503 (interconnect region) of workpiece 500, one or more metal layers are patterned in conductive paths to carry electrical signals. These may include bit lines and vias. Patterned metal layers are separated by dielectric layers (e.g. silicon dioxide or other insulator) that provide electrical isolation. Above upper region 503 is bonding region 504 which includes bond pads that connect to the conductive paths of upper region 503 and/or components of intermediate region 502 and/or substrate 501, to provide for electrical coupling to non-volatile memory cells in intermediate region 502 through conductive traces of upper region 503. Bonding region 504 may include a dielectric layer with bond pads formed in or on the dielectric layer so that pads are exposed at surface 506 (primary surface) and can bond with opposing bond pads in a wafer-to-wafer bonding process.

Figure 6B:
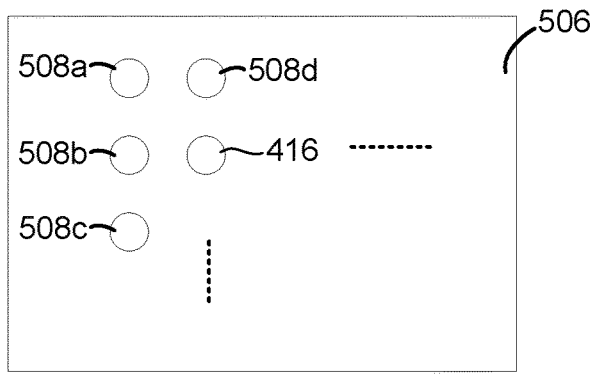

FIG. 6B shows a top-down view of a portion of primary surface 506 of workpiece 500 showing exposed pads including pads 508a-d (which may include active pads coupled to bit lines, word lines, dummy word lines, select gate lines, and test pads provided for test purposes). While a small number of pads are illustrated in this example, it will be understood that a large number of pads may be provided on the surface of a memory die such as workpiece 500. An individual die may include, for example, millions of pads, with a wafer including hundreds or thousands of dies. Bonding region 504 may include a dielectric layer that extends about the pads and isolates neighboring pads. Pads may be made of a suitable electrical conductor such as copper or a copper alloy that contains copper, or other suitable metal or metal alloy.

Figure 7A:
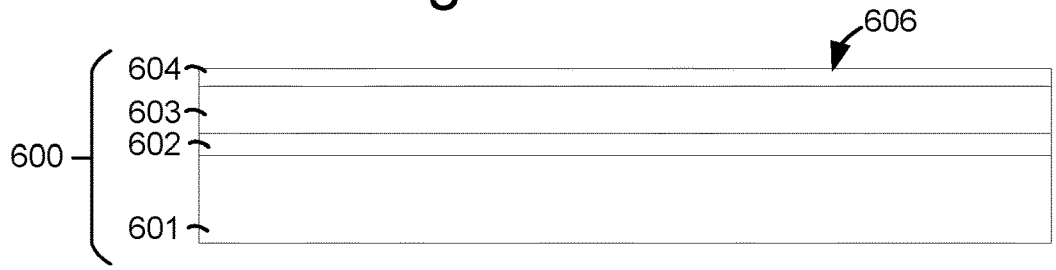
FIGS. 7A-B illustrate a control circuit workpiece including pads for bonding.

FIG. 7A illustrates an example of a peripheral circuitry die workpiece 600 containing control circuits such as the on-die control circuits 310 and other peripheral elements in FIG. 5. Workpiece 600 includes substrate 601, for example a silicon wafer (e.g. 300 mm wafer) or a portion of a wafer. On and above substrate 601 is an intermediate region 602 that may include control circuits formed on (and/or in) substrate 601. For example, intermediate region may include CMOS (Complementary Metal-Oxide-Semiconductor) circuits including control circuits 310 that are formed in an active area of substrate 601. In an upper region 603 (interconnect region) of workpiece 600, one or more metal layers are patterned in conductive paths to carry electrical signals. These may include traces that extend laterally and vias that extend vertically with respect to a primary surface of the substrate. Such conductive paths form electrical connections between different circuits (e.g. connecting components of controller 122). Patterned metal layers are separated by dielectric layers (e.g. silicon dioxide or other insulator) that provide electrical isolation. Above upper region 603 is bonding region 604 which includes bond pads that connect to the conductive paths of upper region 603 and/or components of intermediate region 602 and/or substrate 601, to provide for electrical coupling to circuits in intermediate region 602 through conductive paths of upper region 603. Bonding region 604 may include a dielectric layer with bond pads formed in or on the dielectric layer so that they are exposed at surface 606 (primary surface) and can bond with opposing bond pads in a wafer-to-wafer bonding process.

Figure 7B:
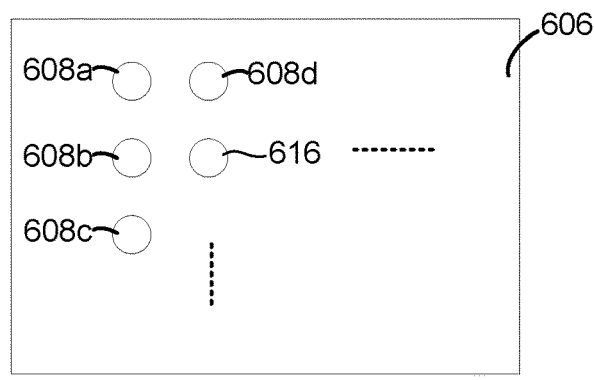

FIG. 7B shows a top-down view of a portion of primary surface 606 of workpiece 600 showing exposed pads including pads 608a-d (which may include active pads and test pads provided for test purposes) and pad 616. Bonding region 604 may include a dielectric layer that extends about the pads and isolates neighboring pads. Pads may be made of a suitable electrical conductor such as copper or a copper alloy that contains copper, or other suitable metal or metal alloy.

Pads 608a-d and 616 may be arranged to connect with corresponding pads of another workpiece for a wafer-to-wafer bonding process. For example, pad 616 may be located so that, when workpieces 500 and 600 are aligned and bonded, pad 616 bonds to pad 416 and the on to an array bit line, for example, and may be controlled by control circuits in intermediate region 602 of workpiece 600. Workpiece 500 may include a number of memory dies and workpiece 600 may include an equal number of control circuit dies in a corresponding pattern (e.g. a one-to-one pattern so that for every memory die of workpiece 500 there is a corresponding control circuit die of workpiece 600). Opposing pairs of dies have corresponding patterns of pads so that, when workpieces are accurately aligned, each pad is aligned with a corresponding pad of an opposing die so that control circuits of workpiece 600 are electrically connected to memory cells of workpiece 500.

FIG. 8A illustrates the process of wafer-to-wafer bonding of workpiece 500 and workpiece 600. Substrate 501 is processed to fabricate memory arrays (e.g. memory structure 326), interconnect structures, and pads for bonding as discussed above with respect to FIGS. 6A-B, thereby forming workpiece 500. Substrate 601 is processed to fabricate peripheral circuits including control circuits (e.g. logic circuits formed as CMOS circuits), interconnect structures, and pads for bonding as discussed above with respect to FIGS. 7A-B, thereby forming workpiece 600. Workpiece 500 is then flipped over in this example (either workpiece may be flipped) so that primary surface 506 of workpiece 500 opposes primary surface 606 of workpiece 600. Workpieces 500, 600 are aligned so that corresponding dies are aligned in pairs and pads on such pairs of dies are aligned for bonding. Subsequently, with workpieces 500, 600 aligned, pressure and/or heat or other conditions are applied to workpieces 500, 600 to bond respective pads together and thus form electrical connections between memory arrays of workpiece 500 and control circuits of workpiece 600 (i.e. bonded along an interface between primary surfaces 506, 606). Bonded workpieces 500 and 600 form a combined workpiece 700 that includes pairs of dies, with each pair including a memory array die and a control circuit die that form a memory system.

FIG. 8B illustrates combined workpiece 700 that includes workpiece 600 and workpiece 500. It can be seen that bonding region 504 of workpiece 500 is in contact with bonding region 604 of workpiece 600 along an interface 701 (i.e. interface between primary surfaces of workpieces 500, 600).

Figure 8C:
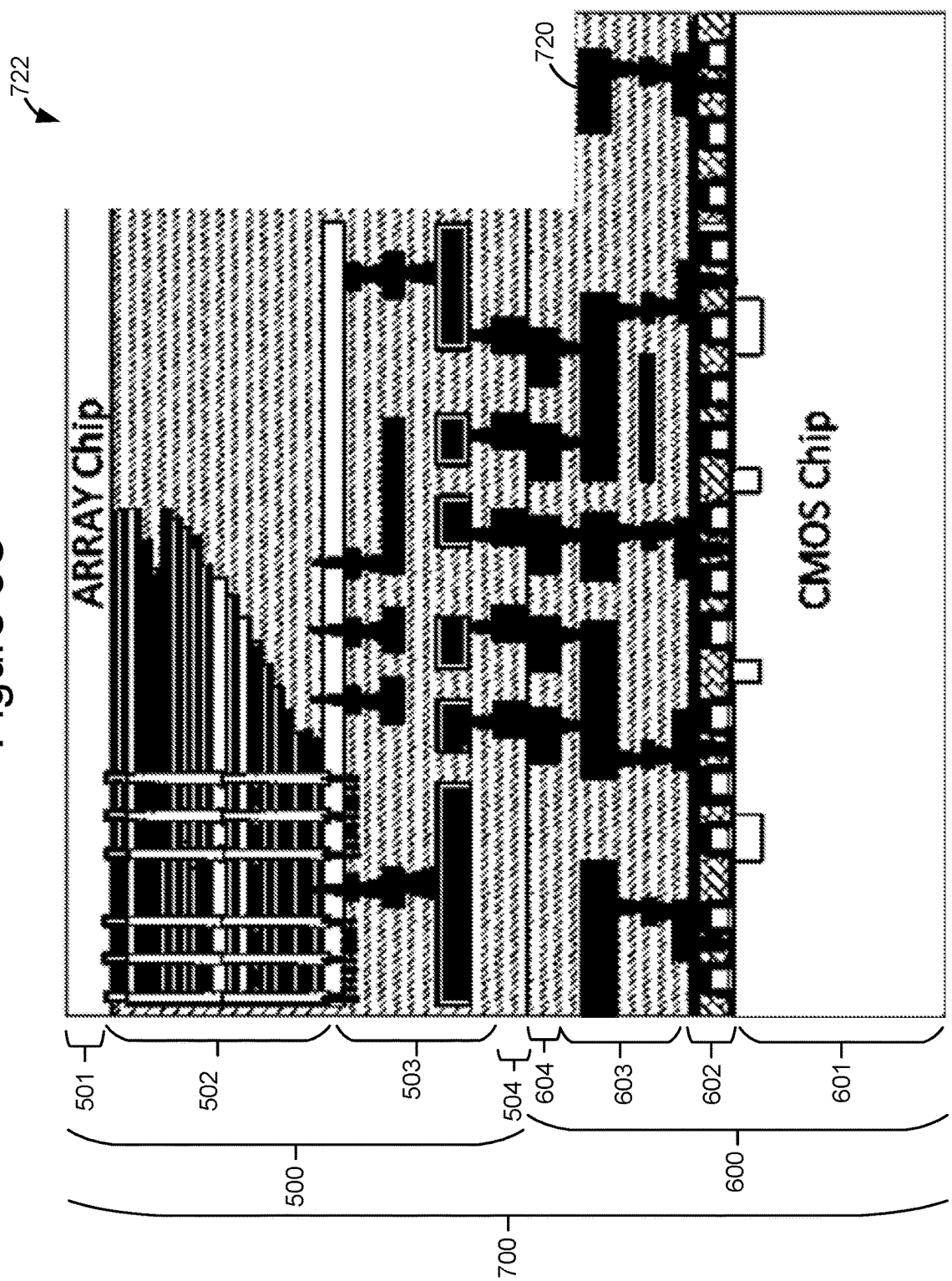

FIG. 8C shows a portion of combined workpiece 700 including substrate 601, intermediate region 602 (including active components formed as CMOS Chip components in and on substrate 601), upper region 603 (including conductive paths formed of traces and vias separated by dielectric), and bonding region 604 that includes pads bonded to corresponding pads of bonding region 504. Pads of bonding region 504 are coupled through conductive paths of upper region 503 to memory array elements in intermediate region 502, which was formed on substrate 501.

While pads along primary surfaces of workpieces 500, 600 may be bonded together and may not be exposed after bonding, additional pads may be provided for connection to other circuits (e.g. to circuits outside combined workpiece 700) and may be exposed for bonding and/or probing. Exposed pad 720 in workpiece 600 is exposed by an opening 722 that extends through workpiece 500. One or more such openings may be provided in each die of workpiece 500 so that designated pads of workpiece 600 remain exposed after wafer-to-wafer bonding of workpieces 500, 600. For example, openings may be etched through workpiece 500 before (or after) wafer-to-wafer bonding. While one exposed pad (pad 720) is shown, it will be understood that any number of exposed pads may be provided. For example, pads may be provided for interfacing with a host, receiving power, testing, and other purposes.

The fabrication process used to form workpiece 500 may be quite different to the fabrication process used to form workpiece 600. For example, while memory structure 326 of workpiece 500 might, for example, include a number of active regions above a substrate surface in a 3-D structure, logic circuits of workpiece 600 may be formed in a single active region. Logic circuits may be formed using a CMOS process while memory structure 126 uses process steps adapted to 3D memory fabrication, which may be different to CMOS process steps. Thus, the number of layers and the materials used may be different. Device dimensions and tolerances may also be different. And thermal budgets may be different. Inclusion of logic circuits in workpiece such as workpiece 500 may require additional process steps since the same process steps used to form memory structure 126 may not be compatible with forming logic circuits. Thus, logic circuits provided in a peripheral area (e.g. CMOS or other logic circuits in peripheral area 104) may be formed separately. This increases the number of process steps which increases risk of damage and creates thermal budget problems.

While FIG. 5 illustrates an example in which memory die 300 includes various circuits in addition to memory structure 326 (e.g. control circuitry 310, read/write circuits 328, and row decoder 324), which may be formed in a peripheral area, reducing or eliminating logic circuits from an array workpiece may reduce the number of process steps needed and reduce thermal budget problems. Wafer-to-wafer bonding provides relatively large areas for bonding large numbers of pads so that a wide interface may be provided between an array workpiece and a control circuit workpiece. This can facilitate a different arrangement of circuits to that shown in FIG. 5. For example, some or all of the peripheral circuitry including control circuitry 310, read/write circuits 328, and row decoder 324 that are shown on memory die 300 may be located on a peripheral or control circuit workpiece in some examples instead of being located on the same die as memory structure 326. This may allow fabrication of an array workpiece for the memory cells that has few or no logic circuits (e.g. no CMOS components) so that fabrication can be significantly simplified and thermal budget concerns are reduced.

Figure 9:
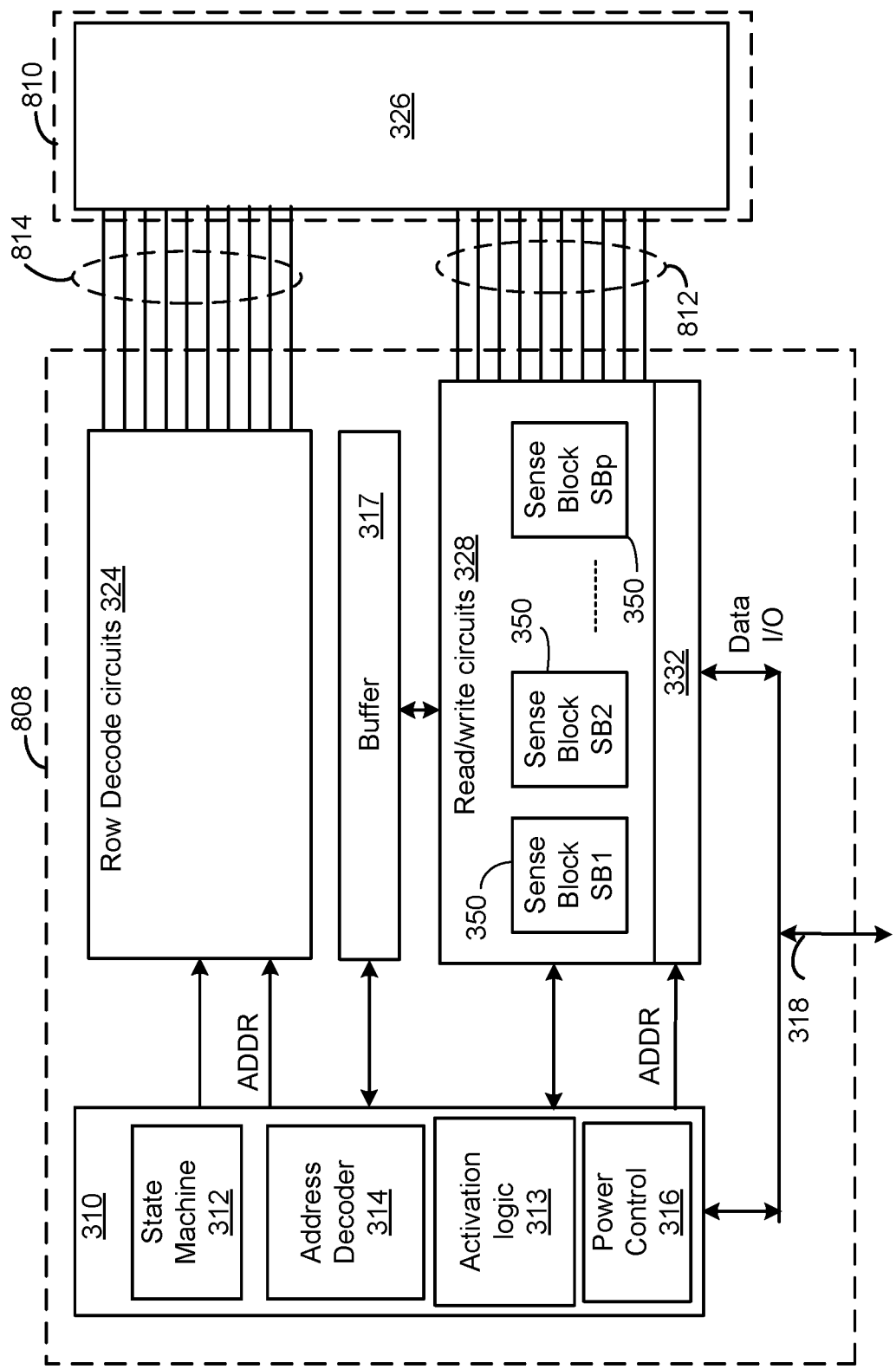
FIG. 9 illustrates an example of control circuits coupled to a memory structure through wafer-to-wafer bonding.

FIG. 9 shows an alternative arrangement to the arrangement of FIG. 5, which may be implemented using wafer-to-wafer bonding. FIG. 9 shows an example of the peripheral circuitry, including control circuits, formed in control circuit die 808 (e.g. a peripheral circuitry die in workpiece 600) coupled to memory structure 326 formed in array die 810 (e.g. an array die in workpiece 500). Common components are numbered as in FIG. 5. It can be seen that control circuitry 310, read/write circuits 328, and row decoder 324 (which may be formed by a CMOS process) are located in control circuit die 808. Additional elements, such as functionalities from controller 102 can also be moved into the control circuit die 808. Control circuitry 310, read/write circuits 328, row decoder 324, and controller 322 may be formed by a common process (e.g. CMOS process), so that adding elements and functionalities more typically found on a memory controller 102 may require few or no additional process steps (i.e. the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control circuit die 808 may not require any additional process steps.

FIG. 9 shows read/write circuits 328 coupled to memory structure 326 through electrical paths 812. For example, electrical paths 812 may provide electrical connection between read/write circuits 328 and bit lines of memory structure 326. Electrical paths may extend from read/write circuits 328 in control circuit die 808 through pads on control circuit die (e.g. pad 616) that are bonded to corresponding pads of array die 810 (e.g. pad 416), which are connected to bit lines of memory structure 326. Each bit line of memory structure 326 may have a corresponding electrical path in electrical paths 812, including a pair of bonded pads, that connects to read/write circuits 328. Similarly, row decoder circuits 324 are coupled to memory structure 326 through electrical paths 814. Each of electrical path 814 may correspond to a word line, dummy word line, or select gate line. Additional electrical paths may also be provided between control circuit die 808 and array die 810.

In the following, state machine 312 and/or controller 102 (or equivalently functioned circuits), in combination with all or a subset of the other circuits depicted in FIG. 9, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit or other type of circuit.

Turning now to types of data that can be stored on non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product. Though the layers are commonly referred to as convolutions, technically these are often a sliding dot product or cross-correlation, such as discussed below with respect to FIG. 13.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 10:
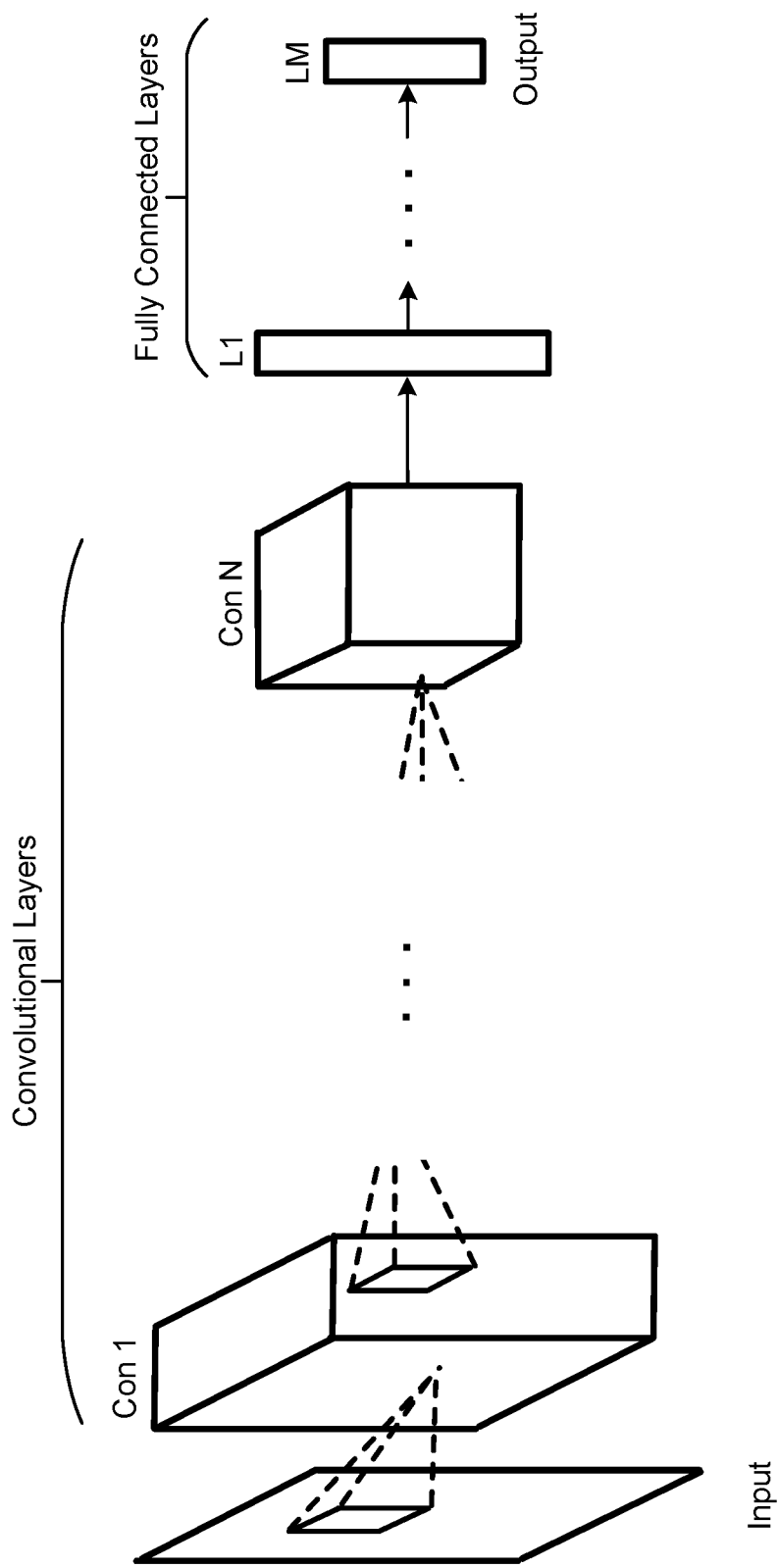
FIG. 10 illustrates a simple example of a convolutional neural network (CNN).

FIG. 10 is a schematic representation of an example of a CNN. Starting from an input image of an array of pixel values, followed by a number convolutional layers, that are in turn followed by a number of fully connected layers, the last of which provides the output. Each neuron in the first convolutional layer takes as input data from an n×n pixel sub-region of the input image. The neuron's learned weights, which are collectively referred to as its convolution filter, determine the neuron's single-valued output response to the input. In the convolution, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through the convolutional layer using each layer's learned weights, after which it is propagated through fully connected layers using their learned weights.

Figure 11:
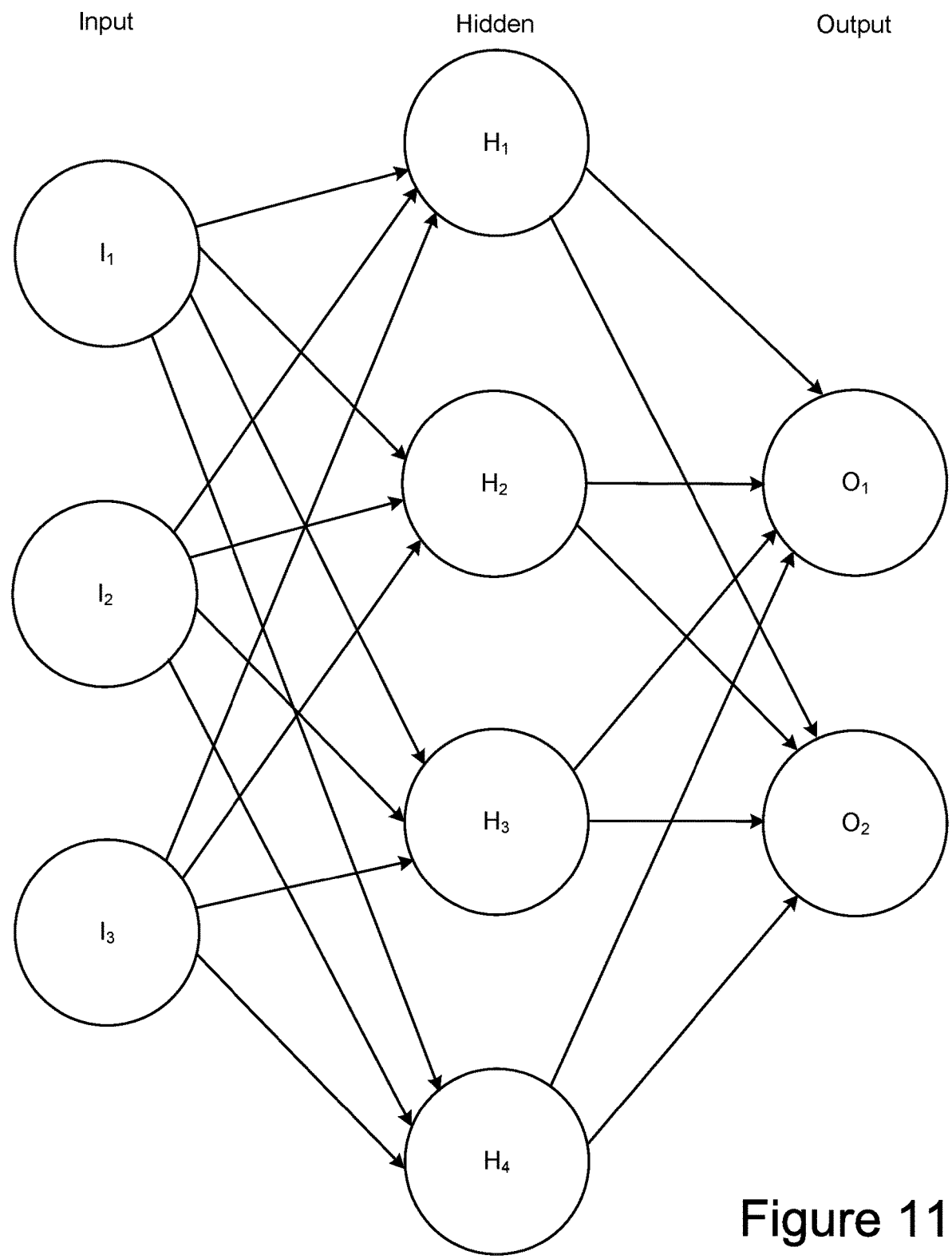
FIG. 11 illustrates a simple example of fully connected layers in artificial neural network.

FIG. 11 represents several fully connected layers of a neural network in more detail. In FIG. 11 the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 6 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 12B:
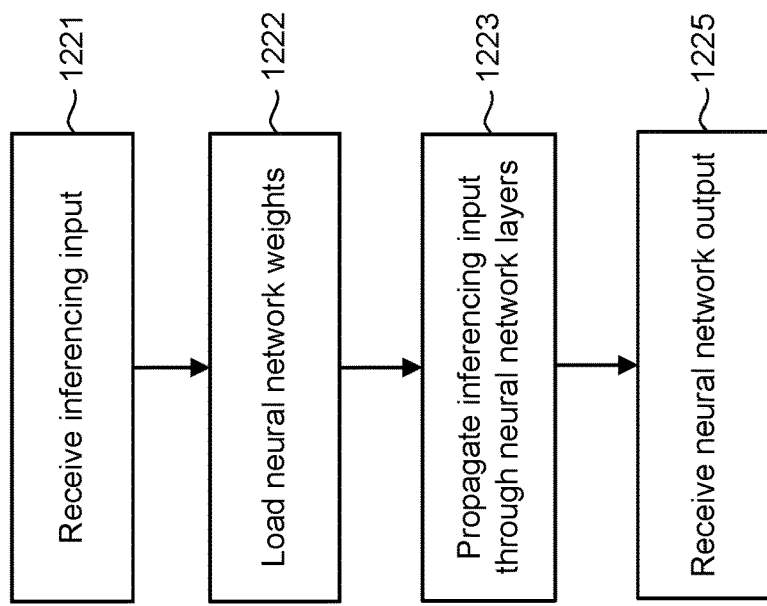
FIG. 12B is a flowchart describing one embodiment of a process for inference using a neural network.
Figure 12A:
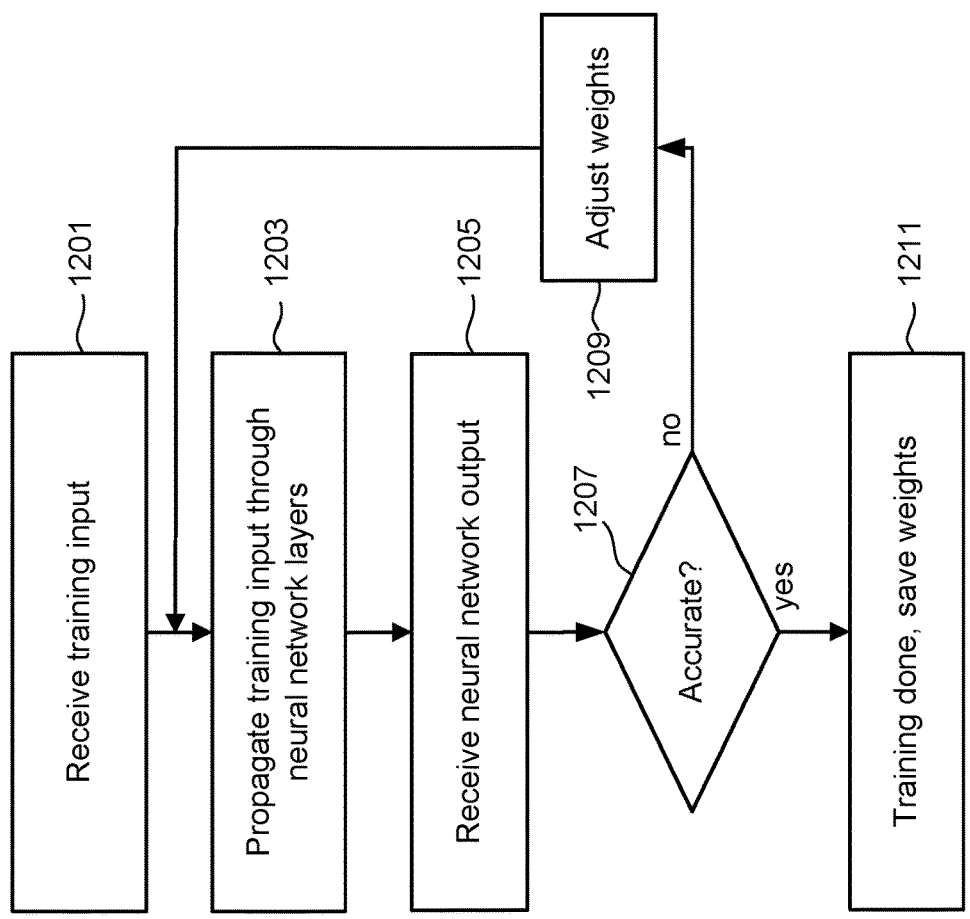
FIG. 12A is a flowchart describing one embodiment of a process for training a neural network to generate a set of weights.

FIG. 12A is a flowchart describing one embodiment of a process for training a neural network to generate a set of weights. The training process is often performed in the cloud, allowing additional or more powerful processing to be accessed. At step 1201, the input, such as a set of images, is received (e.g., the image input in FIG. 10). At step 1203 the input is propagated through the layers connecting the input to the next layer (e.g., CON1 in FIG. 10) using the current filter, or set of weights. The neural network's output is then received at next layer (e.g., CON2 in in FIG. 10) in step 1205, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 1205. A user can then review the results at step 1207 to select which probabilities the neural network should return and decide whether the current set of weights supply a sufficiently accurate labelling and, if so, the training is complete (step 1211). If the result is not sufficiently accurate, the neural network adjusts the weights at step 1209 based on the probabilities the user selected, followed by looping back to step 1203 to run the input data again with the adjusted weights. Once the neural network's set of weights have been determined, they can be used to "inference," which is the process of using the determined weights to generate an output result from data input into the neural network. Once the weights are determined at step 1211, they can then be stored in non-volatile memory for later use, where the storage of these weights in non-volatile memory is discussed in further detail below.

FIG. 12B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 1221, the input is received, such as the image of a dog in the example used above. If the previously determined weights are not present in the device running the neural network application, they are loaded at step 1222. For example, on a host processor executing the neural network, the weight could be read out of an SSD in which they are stored and loaded into RAM on the host device. At step 1223, the input data is then propagated through the neural network's layers. Step 1223 will be similar to step 1203 of FIG. 12B, but now using the weights established at the end of the training process at step 1211. After propagating the input through the intermediate layers, the output is then provided at step 1225.

Figure 13:
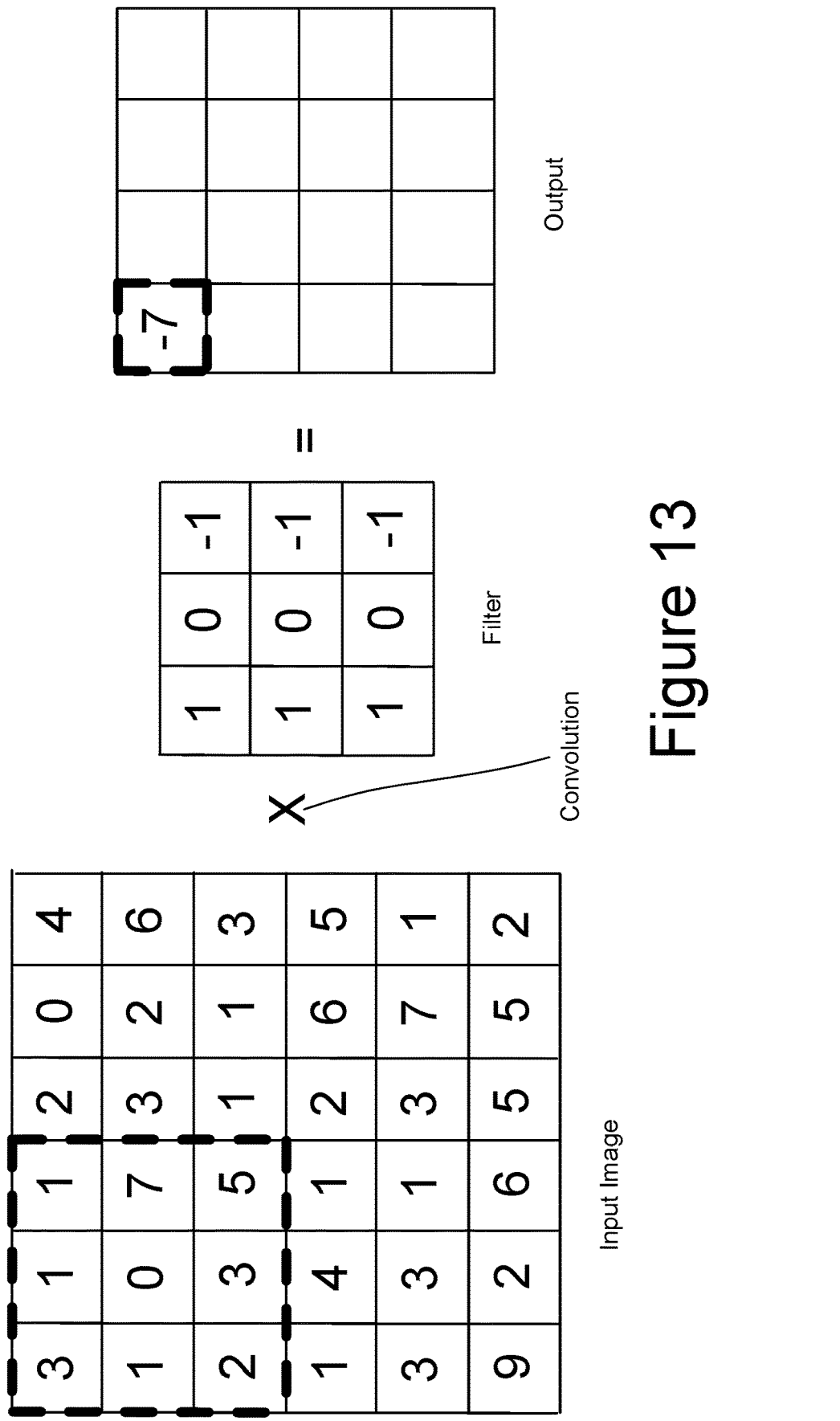
FIG. 13 is a schematic representation of a convolution operation in a convolutional neural network.

FIG. 13 is a schematic representation of a convolution operation between an input image and filter, or set of weights. In this example, the input image is a 6×6 array of pixel values and the filter is a 3×3 array of weights. The convolution operation is performed by a matrix multiplication the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

Figure 14:
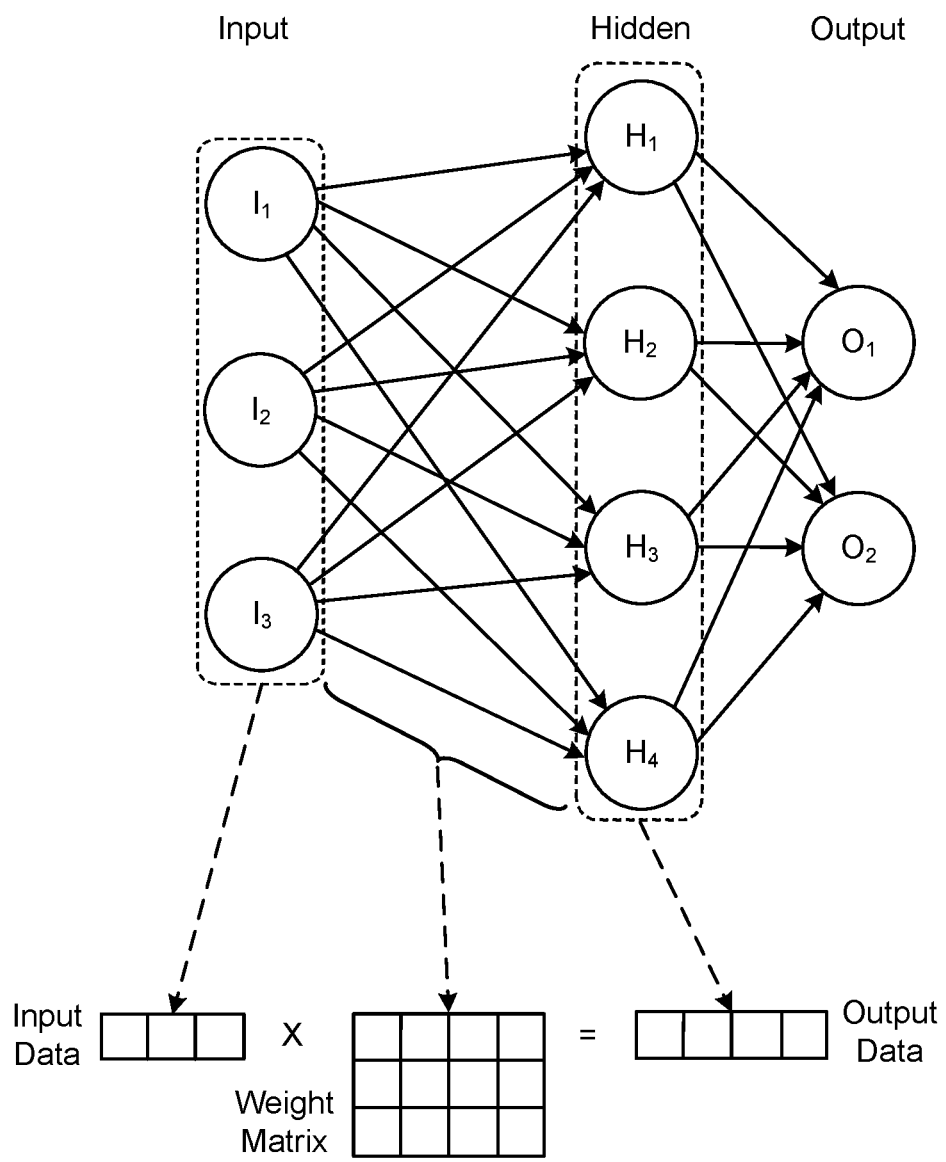
FIG. 14 is a schematic representation of the use of matrix multiplication in a fully connected layer of a neural network.

FIG. 14 is a schematic representation of the use of matrix multiplication in a fully connected layer of a neural network. Matrix multiplication, or MatMul, is a commonly used approach in both the training and inference phases for neural networks and is used in kernel methods for machine learning. FIG. 14 at top is similar to FIG. 11, where only a single hidden layer is shown between the input layer and the output layer. The input data is represented as a vector of a length corresponding to the number of input nodes. The weights are represented in a weight matrix, where the number of columns corresponds to the number of the number of intermediate nodes in the hidden layer and the number of rows corresponds to the number of input nodes. The output is determined by a matrix multiplication of the input vector and the weight matrix, where each element of the output vector is a dot product of the vector of the input data with a column of the weight matrix.

A common technique for executing the matrix multiplications is by use of a multiplier-accumulator (MAC, or MAC unit). However, this has a number of issues. Referring back to FIG. 12B, the inference phase loads the neural network weights at step 1222 before the matrix multiplications are performed by the propagation at step 1223. However, as the amount of data involved can be extremely large, use of a multiplier-accumulator for inferencing has several issues related to loading of weights. One of these is high energy dissipation due to having to use large MAC arrays with the required bit-width. Another is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of NAND memory and Storage Class Memory (SCM), such as those based on ReRAM, PCM, FeRAM or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

Although the storing of weights for a neural network in the non-volatile memory cells of a non-volatile array can save on the transfer of data involved in neural network computations, and the use in-memory computing can remove the need to move data between the memory and a MAC array for a layer of the neural network, but neural networks can have large numbers of layers. To propagate the initial input through the many layers will consequently result in outputs of one layer being transferred from one memory die to serve as input for a layer stored on another memory die. Use of a bonded die pair, such as described above with respect to FIGS. 6A-9, can improve this situation as the increased capacity of the memory can allow for more arrays, larger arrays, or both to formed on the memory die, so that more layers can be computed on a given die. Additionally, the peripheral circuitry die can have more capability than in the case where the control elements were restricted to the margins of the array holding die. Even with the improvements available by use of a bonded die pair, a full neural network, or even a sizable part of a neural network, may require many such bonded die pairs.

Figure 15:
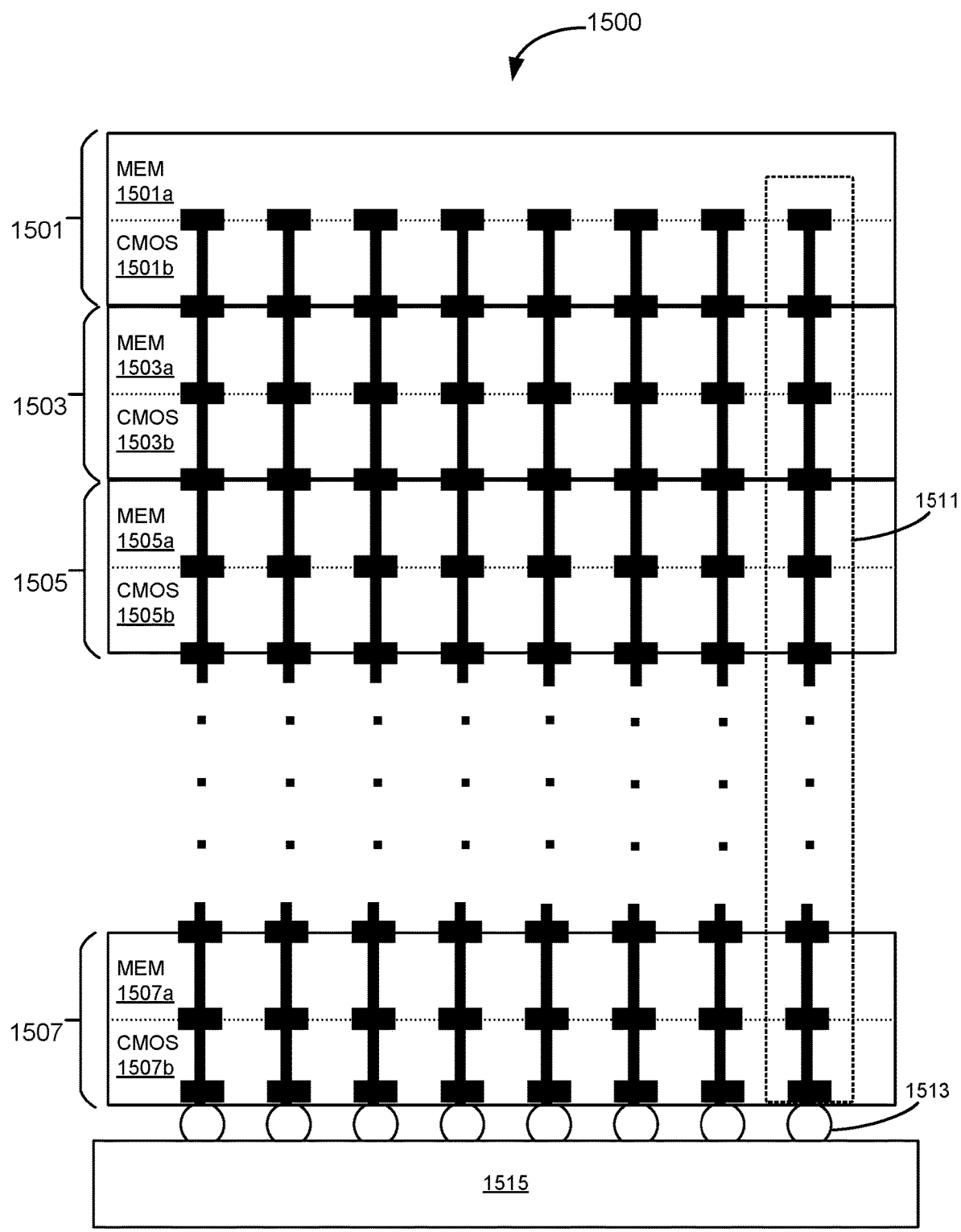
FIG. 15 is a simplified representation of a non-volatile memory structure formed of a stack of bonded die pairs connected by vias.

To increase capacity, a number of such bonded die pairs can be stacked and interconnected. When connecting multiple individual memory chips, such as in a memory package, the individual integrated circuit chips are typically connected by wires bonded to the pads along the edges of the chips. This limits the number of such interconnections as only so many pads can practically be formed in the available space along the edges of a memory chip. The characteristics of the bonding wires can also limit the speed at which signals can be transferred between the individual integrated circuit chips, where there is also a tradeoff between the number of connections available (favoring smaller wires) and the speed of the connections (favoring larger wires). To improve upon this situation, the following introduces embodiments in which multiple bonded die pairs are stacked upon one another and connected by through silicon vias (TSVs). This allows for the output of a neural network from a layer in one bonded die pair in the stack to be transferred over the vias to serve as input for another layer of the neural network that has weights stored in a different bonded die pair in the stack. This allows data to efficiently propagate with a high bandwidth through multiple layers of a neural network all within the stack of bonded die pairs. FIG. 15 illustrates such as arrangement.

FIG. 15 is a simplified representation of a non-volatile memory structure 1500 formed of a stack of bonded die pairs connected by vias. In the example illustrated in FIG. 15, a stack of four bonded die pairs (1501, 1503, 1505, 1507) are shown, where each bonded die pair is here taken to be a memory die MEM (e.g., 1501a) on top of a CMOS logic die (e.g., 1501b). An actual embodiment can include many more such bonded die pairs. The stack of bonded die pairs is on a set of "bumps" 1513, which is in turn on top of a package substrate 1515. A set of through silicon vias, such as 1511, can act as channels for transferring data up and down the stack of bonded die pairs. As with the number of bonded die pairs, the number of vias can vary based on the embodiment. The use of the via structure can provide high bandwidth and low interconnect latency relative to a wire bonded interconnect approach.

Each of the memory die 1501a, 1503a, 1505a, 1505a can hold multiple memory arrays and the arrays of the different memory dies can have differing structures. As described below, when used in an inferencing operation for a neural network, the calculation can be propagated downward or upward through the different bonded die pairs, with the operation at each bonded die pair corresponding to a layer of the neural network. Different types or sizes of memory arrays may be better suited to different stages of the neural network and the memory arrays can be arranged to reflect this. For example, convolutional layers might be better implemented through use of storage class memory arrays and fully connected layers might be better implemented by NAND memory arrays, so that the three dimensional stack of FIG. 15 can be structured so that an input initial propagates through a series of storage class memory arrays followed by a series of NAND memory arrays. The vias of the TSV channels such as 1511 can be used to organize the arrays of different bonded array pairs into columns for propagation through the layers of the neural network. (In addition to the three dimensional structure resulting from the vertical stacking of horizontally arranged bonded die pairs, it should be note that memory cell arrays on the memory dies can also have a 3D structure, such as 3D flash NAND; however, unless otherwise specified, in the following discussion a 3D structure will refer to the stacking of bonded die pairs.)

The CMOS die (1501b, 1503b, 1505b, 1507b) of the different bonded die pairs can also be differentially formed. The movement of the control circuits and other peripheral circuitry onto a separate die opens up a lot of additional area for adding additional logic elements and functionalities, so that different operations can be performed on the data at it propagates through the different layers of a column. Additionally, one or more of the CMOS layers can be structured to move laterally between columns, so that, for example, after propagating through layers of a neural network down one via to the bottom CMOS layer 1507 of the stack, the values can be shifted over and propagated back up another column of arrays. Although not shown in FIG. 15, each of the CMOS layers can also include a number of pins, corresponding to the I/O pins 318 of FIG. 9, so that data and commands can be transferred in and out of the stack at the different layers of bonded die pairs.

The following discussion mainly focusses on using the structure of FIG. 15 for inferencing, where the weight have already been programmed into the memory cells of the structure; however, the structure can also be applied to the training process in which the weight values are determined. An additional task for training in some embodiments is the computation of floating-point gradient decent after each training epoch, then updating weight of weight values. The updating of weight values can be done by re-writing of the updated values for the weights in their current location in the memory arrays or by writing these into other available locations in the structure, with a corresponding updating of logical addresses. The extra space available on the CMOS die can used to implement the additional functionalities on one or more of the CMOS dies, such introduction of a floating point processor on these die.

Relative to FIG. 5, the on-die control circuits of FIG. 9 can also include addition functionalities within its logic elements, both more general capabilities that are typically found in the memory controller 102 and some CPU capabilities, but also application specific features. In the embodiments described here, this can include a wide range of activation functions, which determine the amplitude of the output, for use in the neural network operations described in the following and as represented at the activation logic block 313 of the on-die control circuit. For example, these activation functions can include addition and threshold determination operations used in the accumulation portion of Multiple-ACcumulation (MAC) operations and more advanced operations such as sigmoid or tan h functions. The extra area available on the CMOS (or, more generally, peripheral) circuitry of FIG. 9 can also include buffer memory 317, either volatile or non-volatile, to store data, such as weights of a layer of a neural network, for us in in-logic memory operations.

Neural networks, such as large-scale deep neural networks (DNNs) can have very deep network structures (i.e., very large numbers of layers) and use very large models (i.e., very large numbers of weights in their layers), which presents challenges to support large-scale DNNs. Large-scale DNN models cannot fit onto typical on-chip memory (SRAM) or even off-chip volatile memory (DRAM) for a processor performing an inferencing operation with the model. Because of this, previous implementations of the large-scale DNNs suffer from high cost of data movement between DRAM, SRAM, caches, and CPU/GPU core in both training and inference phases. Although portions of large-scale DNNs can be mapped into a 2D planar architecture, moving data between arrays laterally on a planar structure can introduce large and inconsistent latencies just due to the topological restrictions of moving large amounts of data laterally around the chip structures.

The architecture of FIG. 15 can resolve many of the issues related to large scale DNNs. The multiple memory array dies stacked structure can store extremely large models. The multiple CMOS dies which can be used to implement heterogeneous functions in the different layers, reducing or eliminating the need to move data back and forth across memory hierarchy to CPU/GPU cores or even to the controller 102. The structure can also provide high bandwidth and low interconnect latency by leveraging via structures, significantly reducing data movement costs. Additionally, the structure is highly scalable.

Figure 16:
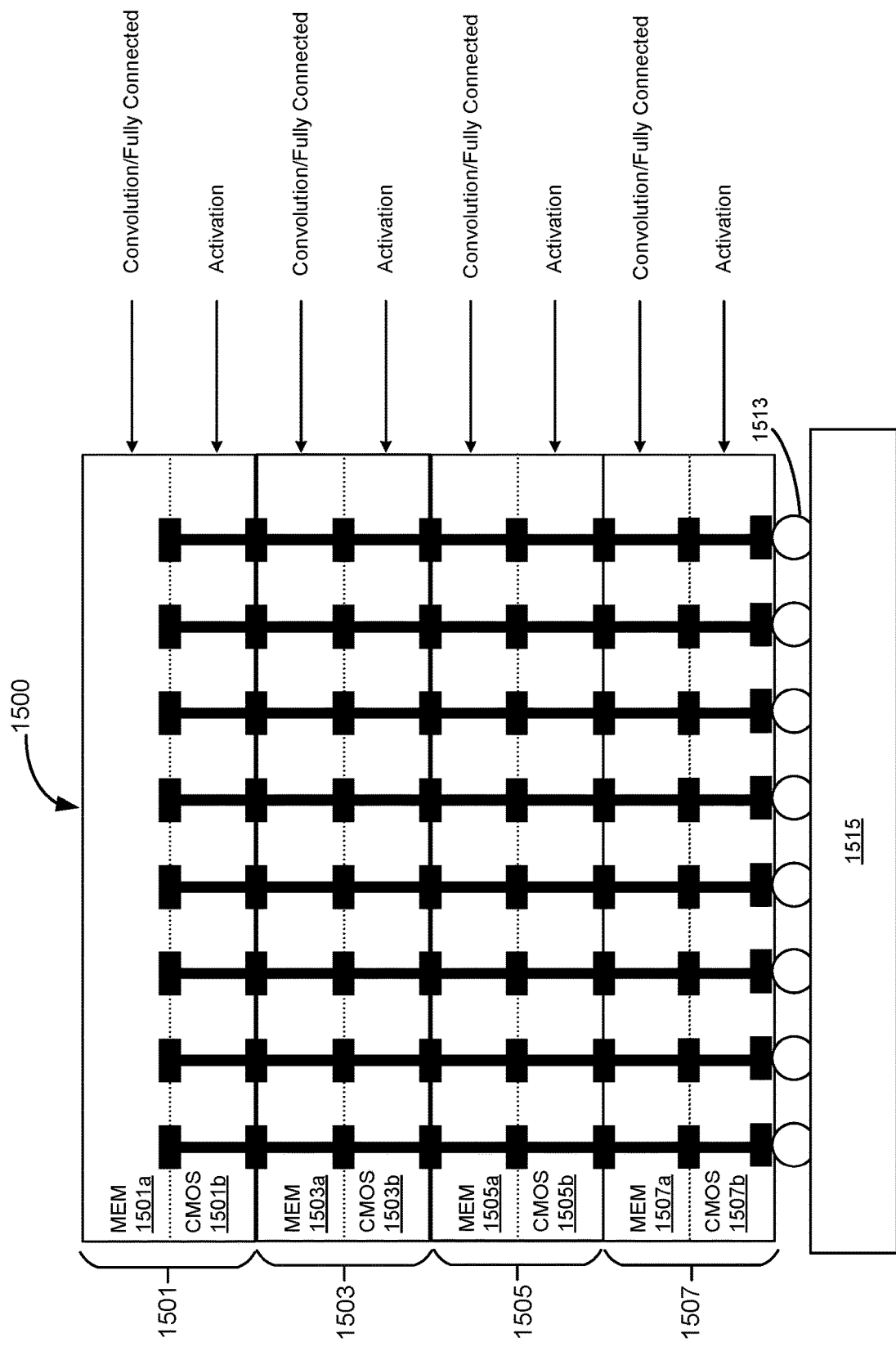
FIGS. 16 and 17 schematically illustrate an inference operation using the structure of FIG. 15 when the convolution or fully connected multiplication operation of a layer is performed within the memory die and in the CMOS die, respectively.
Figure 17:
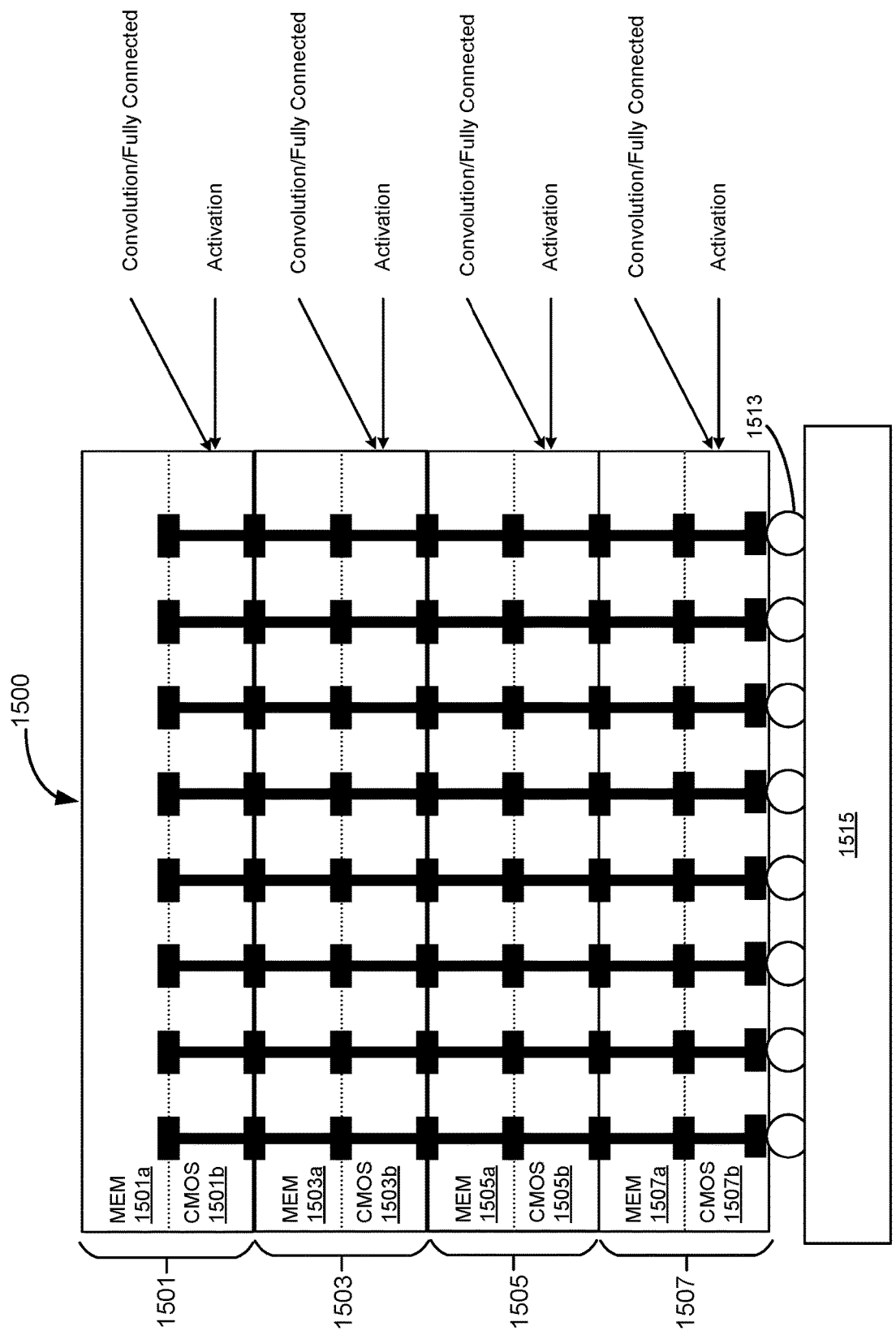

FIGS. 16 and 17 schematically illustrate an inference operation using the structure of FIG. 15 when the convolution or fully connected multiplication operation of a layer is performed within the memory die and in the CMOS die, respectively. In both approaches, the weights for a layer can be stored with the arrays of the memory dies, but in the embodiment of FIG. 16, the input to the layer is applied within the array, while in the embodiment of FIG. 17 the weights are read out into the CMOS die and the layer's inputs applied in the CMOS die. Although represented separately in FIGS. 16 and 17, the two approaches can be combined with in-array multiplication operations in some layers and other layers reading the weights out into the CMOS die.

When performing an inferencing operation for a neural network in either the embodiments of FIG. 16 or 17, weights previously determined during training have been stored in the arrays of the structures. In the arrangement of FIG. 16, in-memory die computation is used, which can leverage the memory dies for both weight storage and computation, both vector and matrix multiplication. Activation functions (such as threshold value determination, sigmoid, tan h, and others) can then be performed in the corresponding CMOS layer. For example, an initial input for a neural network with weights stored in the structure 1500 at, for example, CMOS die 1501b of the bonded die pair 1501. The input is applied to an array of memory die 1501a storing weights to perform an in-array multiplication operation. The result of the in-array multiplication is received back at the CMOS die 1501b, where activation functions can be applied, with the resultant output being passed along a via to another one of the bonded memory die pairs, such as 1503, to serve as the input of the next layer of the neural network.

In the arrangement of FIG. 17, the computations are performed in the logic of the CMOS dies. For example, an initial input for a neural network with weights stored in the structure 1500 at, for example, CMOS die 1501b of the bonded die pair 1501. Either before or after the input is received, the weights for the layer are read out of an array of memory die 1501a and the multiplication between the inputs and the weights is performed in the logic elements of CMOS die 1501b. The CMOS die 1501b can then apply activation functions to the result of the in-logic multiplication, with the resultant output being passed along a via to another one of the bonded memory die pairs to serve as the input of the next layer of the neural network.

With respect to the peripheral circuitry of the CMOS die of the bonded die pair (e.g., 1501b of 1501), a number of functions can be mapped onto the CMOS dies. As discussed above with respect to FIGS. 6A-9, the typically peripheral circuits to support the memory array (e.g., sense amplifiers, decoders, charge pumps, etc.) can be moved onto CMOS die of the bonded die pair. Additionally, the extra space available on the CMOS die under the bonded die pair arrangement can be used for specialized logic or core elements to accelerate domain-specific applications, such as ECC, searching of data, compression, filtering, and so on. The CMOS dies can also incorporate activation functions, such as sigmoid or tan h functions, for use with the neural network layers. Some or all of CMOS dies in the stack can also include some degree of CPU functionality to support domain-general applications. The different CMOS dies in the stack can also differ in capabilities from one another and, in some embodiments, be arranged according to the specific embodiments as, for example, different activation functions might be wanted at differing levels in a neural network and the CMOS dies can be tailored to these needs based on its location in the stack of bonded die pairs.

Figure 18:
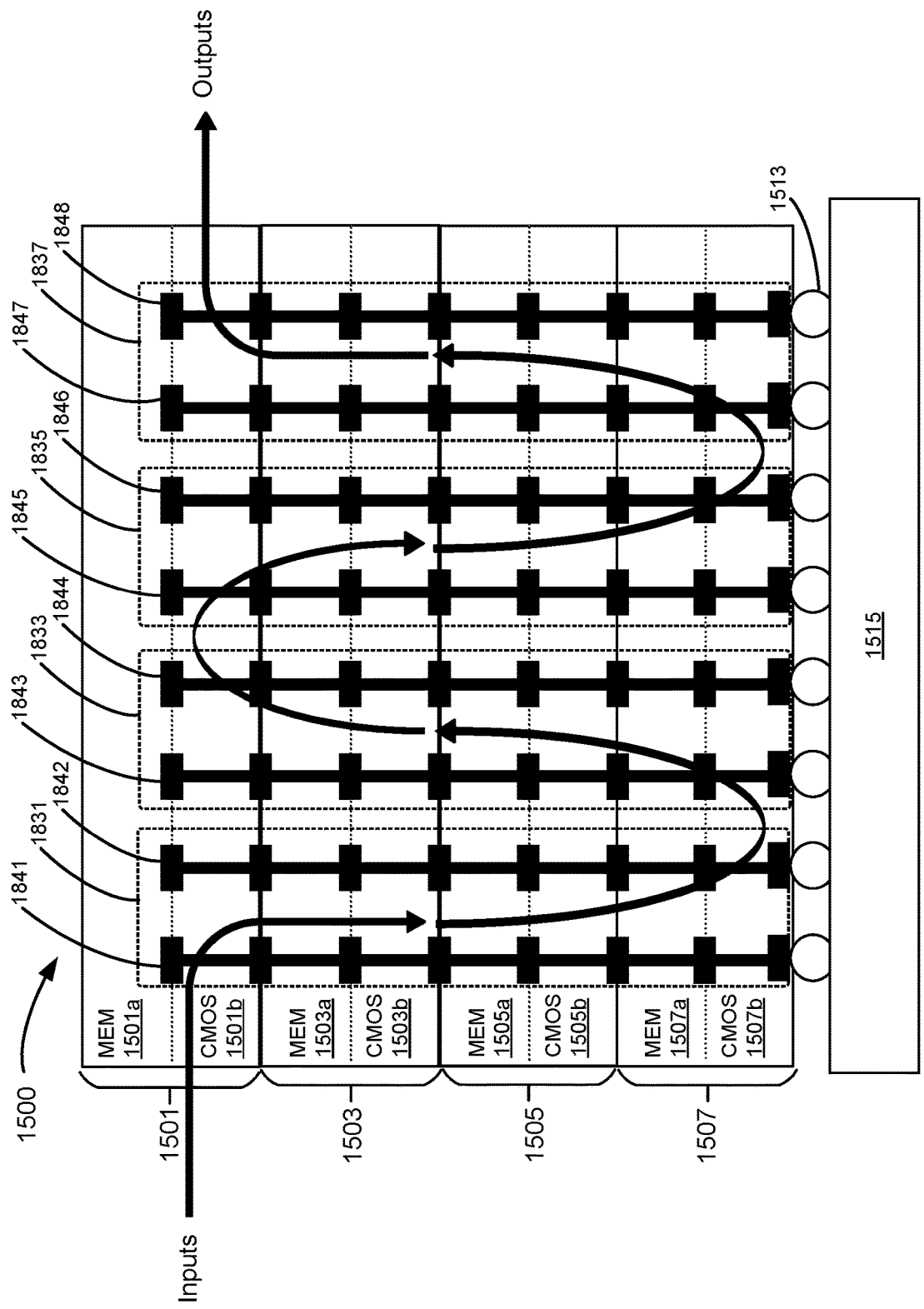
FIG. 18 illustrates the mapping of a 3D deep neural network onto the architecture of FIG. 15.

For example, as discussed above, the output from one layer of the neural network computed in one bonded die pair can be passed down or up a via such as 1511 to another bonded die pair to serve as the input for a subsequent layer of the neural network. By having switch-box interconnects on the CMOS die to be able to transfer the data flow from one column to another, the sequence of layers for the neural network can be extended: as a set of inputs propagates down one column of memory arrays in the stack, the CMOS of the bottom bonded die pair (such as CMOS die 1507a in FIG. 15) can have switch-box interconnects to transfer the flow laterally to another via/column where it is propagated back up the stack. Similarly, when the flow reaches the top of the stack, it could again be transferred laterally and sent back down the stack. FIG. 18 illustrates such an arrangement.

FIG. 18 illustrates the mapping of a 3D deep neural network onto the architecture of FIG. 15. For simplicity of presentation, FIG. 18 again illustrates a stack of four bonded die pairs, numbered as in FIG. 15. Each of the memory dies

1501a, 1503a, 1505a, 1507a are each represented as having four arrays, or planes, organized vertically into four columns, or "iPlane", 1831, 1833, 1835, and 1837, where each of the iPlanes can be run in parallel. In some embodiments, the each of the iPlanes can be used for mapping one or several neural layers. In other embodiments, several iPlanes can be used for mapping a large neural layers for a high level of parallelism.

In the shown embodiments here, each column of arrays is shown as having two through silicon vias (1841, 1842), (1843, 1844), (1845, 1846), and (1847, 1848). Depending on the embodiment, the stack of bonded die pairs can be fewer or greater in number, as can be the number of columns and the number of memory arrays or planes within each the memory dies.

Referring back to the neural networks represented in FIGS. 10 and 11, the weights of each of the layers are stored in an array of a memory die each layer/bonded die pair. The input for a layer are received at the corresponding CMOS die and applied to the weights of the layer, either through an in-array operation (as described with respect to FIG. 16) or by reading out the weights and performing the layer's multiplication in the logic of the CMOS die (as in FIG. 17). For example, the initial input can be received from a memory controller at the CMOS die 1501a, applied to the weights of a first convolutional layer in the array of column 1831 to generate the output of the first convolutional layer, which is then transferred down one or both of the sets of vias 1841 and 1842 to bonded die pair of 1503. The use of the outputs from the previous layer as inputs for the weights of a second convolutional layer as stored in an array of the memory die 1503a in column 1831, the CMOS die 1503b generates the output of the second convolutional layer. This process can propagate down the layers of bonded die pairs until it reaches the bottom of the stack (1507 in this example), where it can moved laterally through switch-box interconnects in CMOS die 1507a to column 1833, where it can propagate up through the layers of the network to the top of the stack, and continue on moving down and up the column as it works its way through the layers. Depending on the implementation, inputs and outputs can be performed at the various levels. The one or more control circuits for the inferencing operation can be the various elements as illustrated for the peripheral element die 808 of FIG. 9, where, depending on the embodiment, the controller 102 can also be part of the control circuitry configured to perform the inferencing operation.

Figure 19:
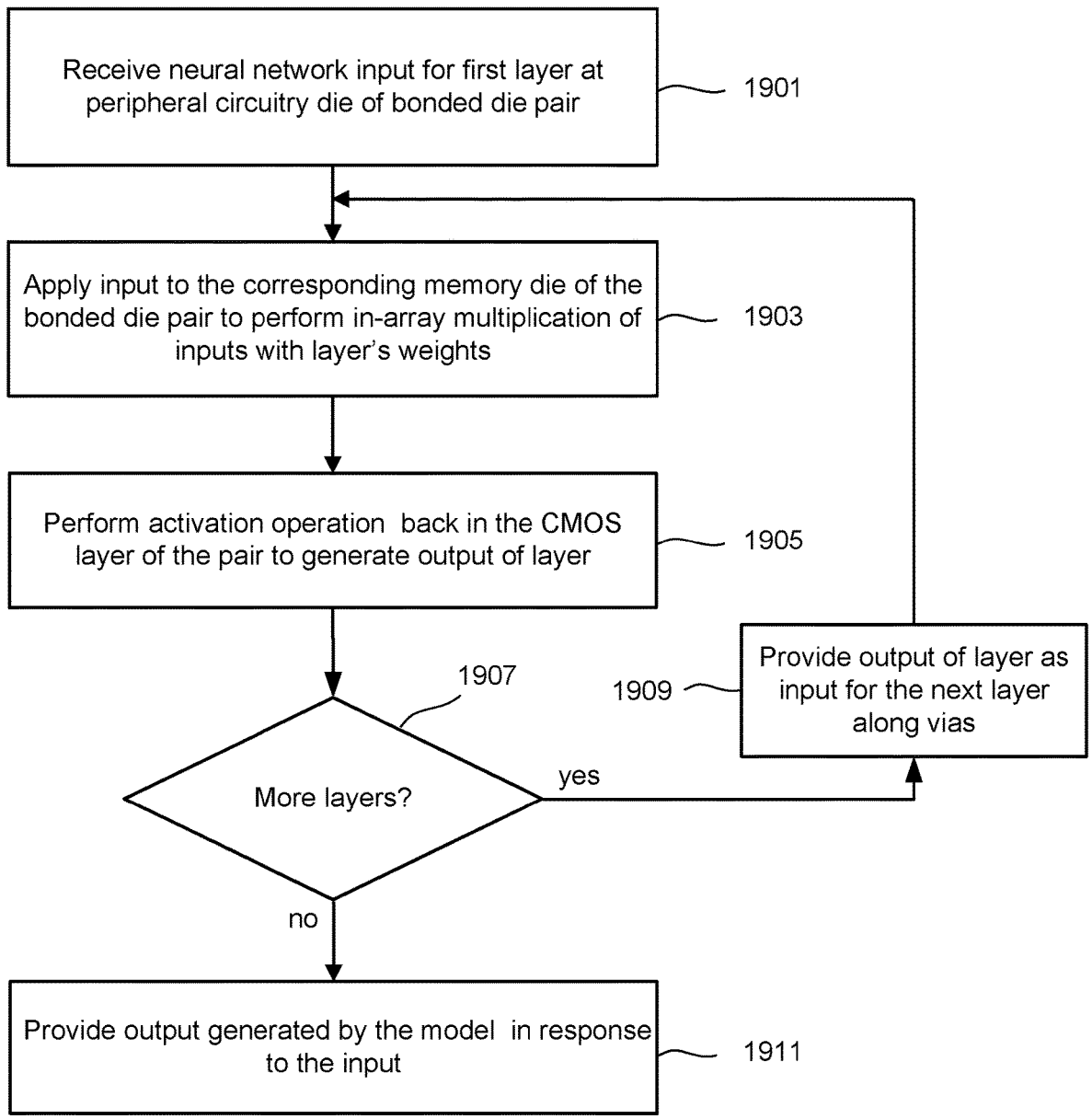
FIGS. 19 and 20 are flowcharts for embodiments of propagating an input to a neural network through the layers of the network as mapped onto the structure of FIG. 15.
Figure 20:
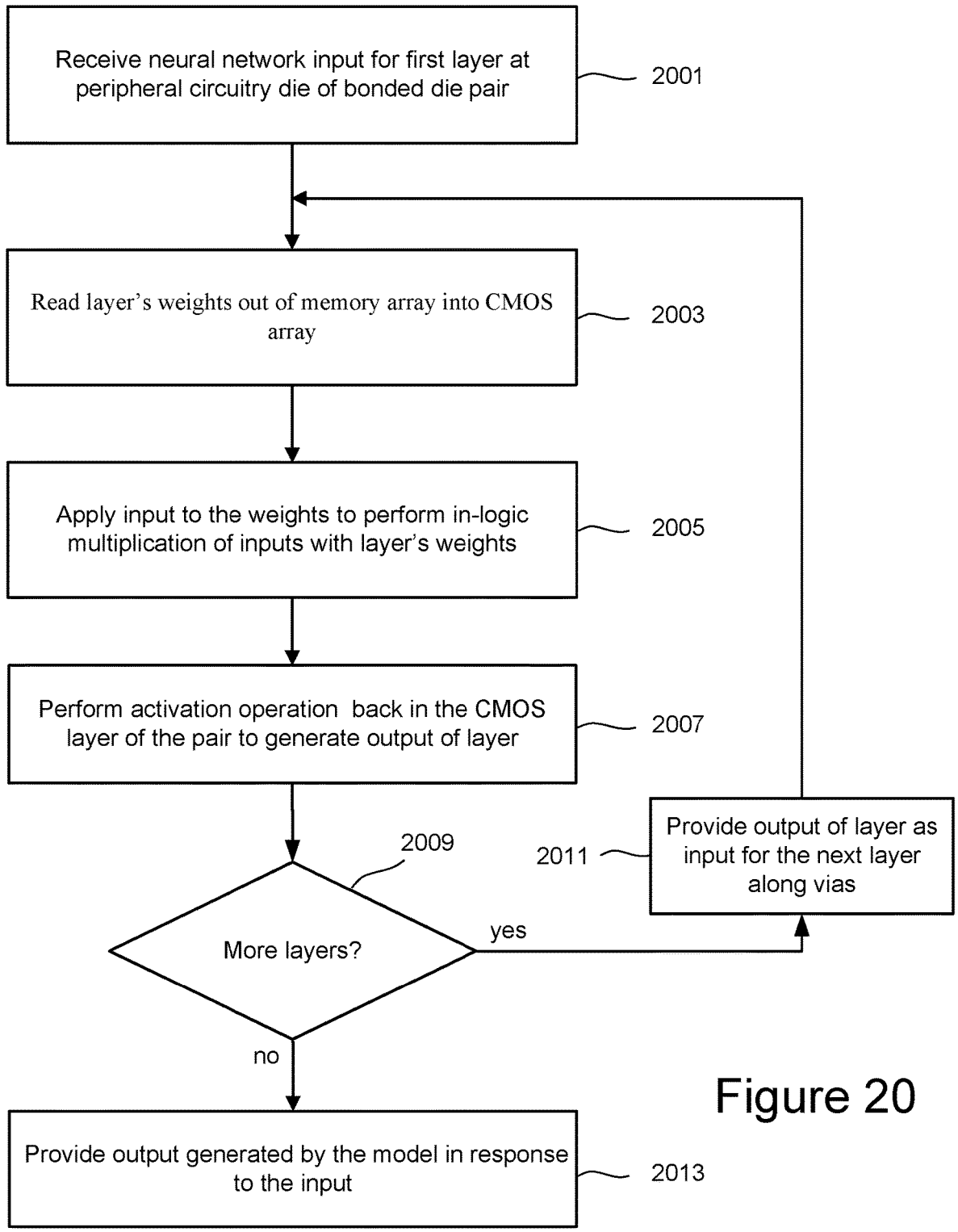

FIGS. 19 and 20 are flowcharts of embodiments for performing an inferencing operation of a neural network by propagating an input through a neural network through the layers of the network as mapped onto the structure of FIG. 15. More explicitly, FIG. 19 corresponds to the arrangement of FIG. 16 and FIG. 20 corresponds to the arrangement of FIG. 17. Although described as two separate embodiments in the following discussion, a hybrid embodiment can also be implemented, in which some layers use in-memory computations (as in FIG. 19) and other layers use in-logic die computations (as in FIG. 20).

FIG. 19 begins at step 1901, with the memory structure of FIG. 18 receiving an input for a neural network. In FIG. 18 this is illustrated as being received at the I/O pins (318 in FIG. 9) of the CMOS die 1501b of the bonded die pair 1501. This input can be the initial input of a neural network, such as at the far left of FIG. 10, or the input of an intermediate layer of a network. Although shown being input at the topmost bonded die pair 1501 of the stack, the input can also be received at other layers, depending on the embodiment and on the layer in which the weights of the appropriate network layer are located. In the example here, the input will initially be propagated down the column 1831.

At step 1903 the input is applied to an array in column 1831 of non-volatile memory cells in the corresponding memory die 1501a to perform an in-array multiplication of the inputs with the weights stored in the array. For example, a vector of input values can be translated in the one or more control circuits of the CMOS die 1501b, such as by the row decode circuits 324, into word line voltages and applied over the lines 814 to the word lines of the array in column 1831 of memory die 1501. The weights of the layer are stored in the non-volatile memory array and the in-array multiplication operation can correspond to the operations illustrated above with respect to FIG. 13 or FIG. 14. The results of the in-array operation between the input matrix or vector with the matrix or vector of the layers weights can correspond to the values on bit lines of the array which can then be supplied over the lines 812 to the read and write circuitry 328 on the CMOS die 1501a. On the CMOS die 1501b, at step 1905 the activation logic 313 can be used to perform an activation operation on the results of the in-memory multiplication of step 1903. Step 1905 can be an accumulation operation or more advanced activation operations and generates the output of the first layer.

Step 1907 determines whether the output of step 1905 is the final output of the neural network computation. If not, the output of step 1905 is propagated to the next layer of the neural network, or, more specifically, to the bonded die pair storing the weights corresponding to the layer at step 1909 to serve as input at step 1903 for the next convolution or multiplication operation. As illustrated in FIG. 18, the output of one layer (e.g., 1501) is propagated down one column (e.g., 1831) along the vias (e.g., 1841, 1842) to the next layer (e.g., 1503), where it serves as the input. In embodiment of FIG. 18, the results of the convolutions or multiplications are propagated down vias 1841 and 1842 of column 1831 to the bottom layer 1507, where it is transferred laterally to column 1833 and propagated upward along vias 1843 and 1844. Once at the top-most layer 1501, it is again moved laterally and propagated down column 1835, and so on through the neural network layers as mapped onto the structure of FIG. 18.

If step 1907 determines that the output of step 1905 is the last layer of the sequence, the output from step 1905 is provided as the output of operation at step 1911. Depending on the embodiment and implementation, this could the final output (as at far right of FIG. 10) or an intermediate result. Depending on the depth of the network and size (number of layers, number of arrays per layer), a full propagation from initial input to final output may be possible on single device as illustrated in FIG. 18, or use several such devices. If the propagation uses less than available layers of the structure of FIG. 18, it can either be propagated to a final output (such as in layer 1505 and column 1837 of FIG. 18) or output from I/O pins 318 of the CMOS die in the layer generating the final output.

The embodiment of FIG. 20 also stores the weights of a network in the memory dies of the structure of FIG. 18, but performs the computation in the logic of the CMOS (or, more generally, the peripheral circuitry) die of the bonded die pair. The flow of FIG. 20 begins at step 2001, with the memory structure of FIG. 18 receiving an input for a neural network. Step 2001 can be as described above for the corresponding step 1901 of FIG. 19. Unlike in FIG. 19 where the computation is performed in the memory array at step 1903, in FIG. 20 at step 2003 the weights of the layer are now read out of the memory die (e.g., an array in column 18031 of memory die 1501*a*) into the corresponding CMOS die (e.g., 1501*b*) for the input of the layer to be applied to the weights of the layer to perform an in-logic multiplication at step 2005.

More explicitly, referring to FIG. 9, at step 2003 the control circuitry on CMOS die 808 reads out the weight values from the array structure 326 over lines 812 to the read/write circuits 328, which can include buffer memory 317 to store the weight values for the layer. The convolution or multiplication of the inputs with weight values, such as described above with respect to FIG. 13 or 14, can then be performed in-logic on the memory die. At step 2007, activation operations can be performed on the result of the multiplication of step 2005, similarly to the process described above with respect to step 1905 of FIG. 19. The flow of FIG. 20 can then continue with steps 2009, 2011, and 2013 that can respectively correspond to steps 1907, 1909, and 1911 as described above.

For either of the embodiments of FIG. 19 or 20, the propagation of the input through the structure of FIG. 18 can be performed with varying degrees autonomy, with the control circuits (as illustrated in FIG. 9) within the CMOS dies of the bonded die pairs performing the propagation of the initial neural network inputs through layers independently of the controller 102 or with varying degrees of controller oversight. Additionally, although FIGS. 19 and 20 describe the propagation of a single set of inputs to the network, multiple sets of inputs can propagate sequentially through the structure of FIGS. 15-18: once one set of inputs moves out from the first layer to the second layer, a subsequent set of inputs can be received at the first layer, resulting in a high level of parallelism.

Although FIG. 18 illustrates, and FIGS. 19 and 20 describe, an input being received at the CMOS die of a first bonded die pair and applied to an array in the first column of a corresponding memory die, such as the array in column 1831 for memory die 1501*a*, and propagated sequentially through the layers to an output, such as at the CMOS die 1507*b* in column 1837, a number of variations are possible in alternate embodiments. For example, some layers can be skipped. Such skipping could be used when there are multiple sets of weights for the same layer of a network: for example, the different sets of weight could correspond to different models of the same network, and one these weight could be selected and the others skipped based on the model currently selected. In other variations, additional inputs could be received at different layers along the way; intermediate outputs could be provided from intermediate layers; and data could be moved laterally between columns of a given layer to provide more general computations.

The structures described above can provide a 3D mapping of deep neural networks onto a stack of bonded die pair non-volatile memory devices. By having the multiple arrays or planes of the memory die of the bonded die pairs organized into column, a high degree of parallelism can be achieved and high performance provided as the need to move large amounts of data in and out of memory is avoided. The use of through silicon vias (TSVs) improves inter-plane data propagation. The separation of the memory array and the peripheral circuitry onto separate dies of a bonded die pair increases the memory capacity available for storing weights. The increased area available on the CMOS die of the bonded die pairs increases the complexity of activation and other functions that can be applied to the data as it moves through the layers. Although applied here to a 3D deep neural network, the architecture can be used to realize accelerator-centric compute in-memory or near-memory computing systems for other application domains, such a database applications.

According to a first set of aspects, a non-volatile memory device includes a plurality of stacked, bonded die pairs and one or more vias each connecting a plurality of the bonded die pairs. Each bonded die pair include: a memory die having one or more arrays of non-volatile memory cell, each array configured to store one or more weights of a layer of a neural network; and a corresponding peripheral circuitry die, formed separately from and bonded to the memory die, and having peripheral circuit elements, including one or more control circuits, connected to and configured to perform memory operations on the one or more arrays. The one or more control circuits are configured to: receive a set of input values for a layer of the neural network having weights stored one of the arrays of the memory die; and perform a multiplication operation between the set of input values and the weights of the layer of the neural network to generate a set of output values for the layer of the neural network. The one or more vias are configured to transfer data between the connected bonded die pairs connected thereto, the vias configured to transfer a set output values of a multiplication operation in a first of the bonded die pairs to be a set of input values of a multiplication operation in a second of the bonded die pairs.

In additional aspects, a method includes receiving an initial input for a neural network at a peripheral circuitry die of a first bonded die pair of a non-volatile memory structure. The non-volatile memory structure includes a plurality bonded die pairs, including the first bonded die pair, each of the bonded die pairs including a peripheral circuitry die and a non-volatile memory die, each of the non-volatile memory dies storing weights for one or more layers of the neural network. The method also includes propagating the input for the neural network through a sequence of the bonded die pairs, the bonded die pairs forming a three dimensional stack in which the bonded die pairs are connected by through silicon vias. The propagating includes: at the first bonded die pair, generating an output for a layer of the neural network stored on the memory die of the first bonded die pair from the initial input; and, at each of one or more subsequent bonded die pairs in the sequence, receiving along the vias an output from the preceding bonded die pair in the sequence and generating an output for a layer of the neural network stored on the memory die of the subsequent bonded die pair using the output from the preceding bonded die pair as input. The method also includes providing an output of the neural network from the peripheral circuitry die of one of the subsequent bonded die pairs.

Further aspects include a non-volatile memory device including: a stack of a plurality of bounded die pairs, each bonded die pair having a memory die with one or more arrays of non-volatile memory cells and a peripheral circuitry die having one or more control circuits configured to access data stored on the memory die of the bonded die pair; and a plurality of vias through the stack of bonded die pairs configured to transfer data between the bonded die pairs, the arrays of the memory dies organized into columns along the vias. The memory dies of the plurality of the bonded die pairs are configured to store weights of a plurality of layers of a neural network, a sequence of layers of the neural network being mapped into a corresponding sequence of the arrays along the columns. The control circuits of the peripheral circuitry dies of the plurality of the bonded die pairs are further configured to perform an inferencing operation for the neural network by receiving an input for the neural network at first of bonded die pairs and propagating the input through the layers of the neural network by propagating the input though the corresponding sequence of the arrays along the columns, performing a multiplication operation in each of the bonded die pairs using the weights store in the corresponding array.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   one or more first control circuits configured to connect to a first set of one or more arrays of non-volatile memory cells, each array configured to store one or more weights of a layer of a neural network, and to connect to one or more vias, the one or more first control circuits are configured to:
      receive a set of input values for a layer of the neural network having weights stored one of the first set of arrays;
      perform an in-array multiplication operation between the set of input values and the weights of the layer of the neural network stored in the first set of arrays;
      determine a set of output values for the layer of the neural network from the in-array multiplication operation; and
      transfer the set of output values over the vias to one or more second control circuits.

2. The apparatus of claim 1, wherein, in determining the set of output values for the layer of the neural network, the one or more first control circuits are configured to:
   perform an activation operation on the set of output values subsequent to performing the multiplication operation between the set of input values and the weights of the layer of the neural network.

3. The apparatus of claim 1, the one or more first control circuits are further configured to:
   perform a subsequent in-array multiplication operation between the output values for the layer of the neural network and weights of an additional layer of the neural network stored in the first set of arrays.

4. The apparatus of claim 1, wherein the one or more first control circuits are formed on a first control die, the apparatus further comprising:
   a first memory die including the first set of one or more arrays, the first memory die formed separately from and bonded to the first control die to form a first bonded die pair; and
   a second bonded die pair, including a second control die on the one or more second control circuits are formed, the first bonded die pair and the second bonded die pair are part of a plurality of stacked, bonded die pairs; and
   the one or more vias each connecting the first control die and the second control die and configured to transfer data between the first control die and the second control die.

5. The apparatus of claim 4, wherein, in determining the set of output values for the layer of the neural network, the one or more first control circuits are configured to:
   perform a first activation operation on the set of output values subsequent to performing the multiplication operation between the set of input values and the weights of the layer of the neural network, and
   wherein the one or more second control circuits are configured to:
      receive set of output values over the vias; and
      perform a second activation operation on the received set of output values.

6. The apparatus of claim 4, wherein the first control die is a CMOS die.

7. The apparatus of claim 4, wherein the first memory die is formed in an NMOS process.

8. The apparatus of claim 4, wherein the first memory die is a storage class memory die.

9. An apparatus, comprising:
   a stack of a plurality of bonded die pairs connected along a plurality of vias configured to transfer data between the bonded die pairs, each of the bonded die pairs comprising:
      a memory die having one or more arrays of non-volatile memory cells, each array configured to store one or more weights of a layer of a neural network; and
      a control die having one or more control circuits configured to access data stored on the memory die of the bonded die pair,
   where the arrays of the memory dies are organized into columns along the vias and the control circuits are further configured to:
      receive an input for the neural network at first of bonded die pairs; and
      propagate the input through the layers of the neural network by propagating the input though a corresponding sequence of the arrays along the columns, performing a multiplication operation in each of the bonded die pairs using the weights stored in the corresponding array in the sequence.

10. The apparatus of claim 9, wherein:
the layers of the neural network include both convolutional layers and fully connected layers.

11. The apparatus of claim 9, wherein the multiplication operation in one or more of bonded die pairs using the weights stored in the corresponding array in the sequence is performed in the memory die of the bonded die pair.

12. The apparatus of claim 9, wherein the multiplication operation in one or more of bonded die pairs using the weights stored in the corresponding array in the sequence is performed in the control die of the bonded die pair.

13. The apparatus of claim 9, wherein the control circuits of the control dies of the plurality of the bonded die pairs are further configured to:
propagate the input though a plurality of the corresponding sequence of the arrays along a first of the columns in a first direction; and
subsequently propagate the input though a plurality of the corresponding sequence of the arrays along a second of the columns in a second direction.

14. The apparatus of claim 9, wherein the control die are CMOS die.

15. The apparats of claim 9, wherein the memory die are formed in an NMOS process.

16. A method, comprising:
receiving a first input for a neural network;
performing an inferencing operation for the input of the neural network and a plurality of layer of the neural network by:
  receiving the first input at a control die of a first bonded die pair of anon-volatile memory structure, the non-volatile memory structure comprising a plurality bonded die pairs, including the first bonded die pair, each of the bonded die pairs including a control die and a non-volatile memory die, each of the non-volatile memory dies storing weights for one or more layers of the neural network;
  propagating the first input through a sequence of the bonded die pairs, the bonded die pairs forming a three dimensional stack in which the bonded die pairs are connected by through silicon vias, the propagating including:
    at the first bonded die pair, generating an output for a layer of the neural network stored on the memory die of the first bonded die pair from the first input; and
    at each of one or more subsequent bonded die pairs in the sequence:
      receiving along the through silicon vias an output from the preceding bonded die pair in the sequence; and
      generating an output for a layer of the neural network stored on the memory die of the subsequent bonded die pair using the output from the preceding bonded die pair as input; and
  providing an output of the inferencing operation from the control die of one of the subsequent bonded die pairs.

17. The method of claim 16, wherein the layers of the neural network include both convolutional layers and fully connected layers.

18. The method of claim 16, wherein, in one or more of the bonded die pairs, generating an output for a layer of the neural network stored on the memory die includes:
performing a multiplication between the input and the weights of the layer of the neural network in the memory die of the bonded die pair.

19. The method of claim 16, wherein, in one or more of the bonded die pair, generating an output for a layer of the neural network stored on the memory die includes:
reading the weights of the layer of the neural network from the memory die of the bonded die pair; and
performing a multiplication between the input and the weights of the layer of the neural network in logic of control die of the bonded die pair.

20. The method of claim 16, wherein, for each of the subsequent bonded die pairs, generating the output for the layer includes applying an activation function, the activation functions differing between two or more of the subsequent bonded die pairs.

* * * * *